US012593659B2

(12) United States Patent
Kim et al.

(10) Patent No.: US 12,593,659 B2
(45) Date of Patent: Mar. 31, 2026

(54) SPECTROSCOPIC DEVICE, SPECTROSCOPIC METHOD USING THE SAME, AND METHOD OF FABRICATING SEMICONDUCTOR MEMORY DEVICE USING THE SAME

(71) Applicant: Samsung Electronics Co., Ltd., Suwon-si (KR)

(72) Inventors: Jaeho Kim, Suwon-si (KR); Souk Kim, Seoul (KR); Younghoon Sohn, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 718 days.

(21) Appl. No.: 17/895,486

(22) Filed: Aug. 25, 2022

(65) Prior Publication Data

US 2023/0154804 A1     May 18, 2023

(30) Foreign Application Priority Data

Nov. 17, 2021     (KR) ........................ 10-2021-0158818

(51) Int. Cl.

| | |
|---|---|
| *H01L 21/66* | (2006.01) |
| *G01J 3/18* | (2006.01) |
| *G02B 5/18* | (2006.01) |
| *H10B 43/10* | (2023.01) |
| *H10B 43/27* | (2023.01) |

(52) U.S. Cl.
CPC ................ *H01L 22/12* (2013.01); *G01J 3/18* (2013.01); *H10B 43/10* (2023.02); *H10B 43/27* (2023.02); *G02B 5/18* (2013.01)

(58) Field of Classification Search
CPC ........ G01J 3/06; G01J 3/10; G01J 3/18; G01J 3/2803; G02B 27/1086; G02B 5/18
See application file for complete search history.

(56) References Cited

U.S. PATENT DOCUMENTS

| | | | |
|---|---|---|---|
| 6,456,376 | B1 | 9/2002 | Liphardt et al. |
| 6,654,165 | B2 | 11/2003 | Engelhardt et al. |
| 7,113,282 | B2 | 9/2006 | Aguirre et al. |
| 7,215,422 | B2 | 5/2007 | Florek et al. |
| 7,710,559 | B2 | 5/2010 | Imura |
| 7,839,502 | B2 | 11/2010 | Lukas et al. |

(Continued)

FOREIGN PATENT DOCUMENTS

KR          101078135 B1     10/2011

*Primary Examiner* — Hina F Ayub
(74) *Attorney, Agent, or Firm* — HARNESS, DICKEY & PIERCE, P.L.C.

(57)          ABSTRACT

A spectroscopic device may include a light source part configured to emit a first light toward a target object, the light source part including a main light source and a plurality of auxiliary light sources, a diffraction part including a diffraction grating configured to diffract a second light that is produced based on the first light being reflected from the target object, the diffraction grating configured to produce a third light that is the diffracted second light, a detection part configured to detect the third light, and an analyzing part connected to the detection part. The detection part may include a plurality of pixels and an actuator. The plurality of auxiliary light sources may be configured to emit light rays of different wavelengths. The actuator may be configured to rotate and move the detection part.

20 Claims, 19 Drawing Sheets

(56) References Cited

U.S. PATENT DOCUMENTS

| | | | |
|---|---|---|---|
| 10,113,964 B2 | 10/2018 | Yeo et al. | |
| 10,809,193 B2 | 10/2020 | Van Dam et al. | |
| 2007/0103682 A1* | 5/2007 | Yoo ....................... | G01J 3/0218 |
| | | | 356/318 |
| 2020/0049553 A1* | 2/2020 | Minato .................... | G01J 3/28 |
| 2021/0021099 A1 | 1/2021 | Vizbaras et al. | |

* cited by examiner

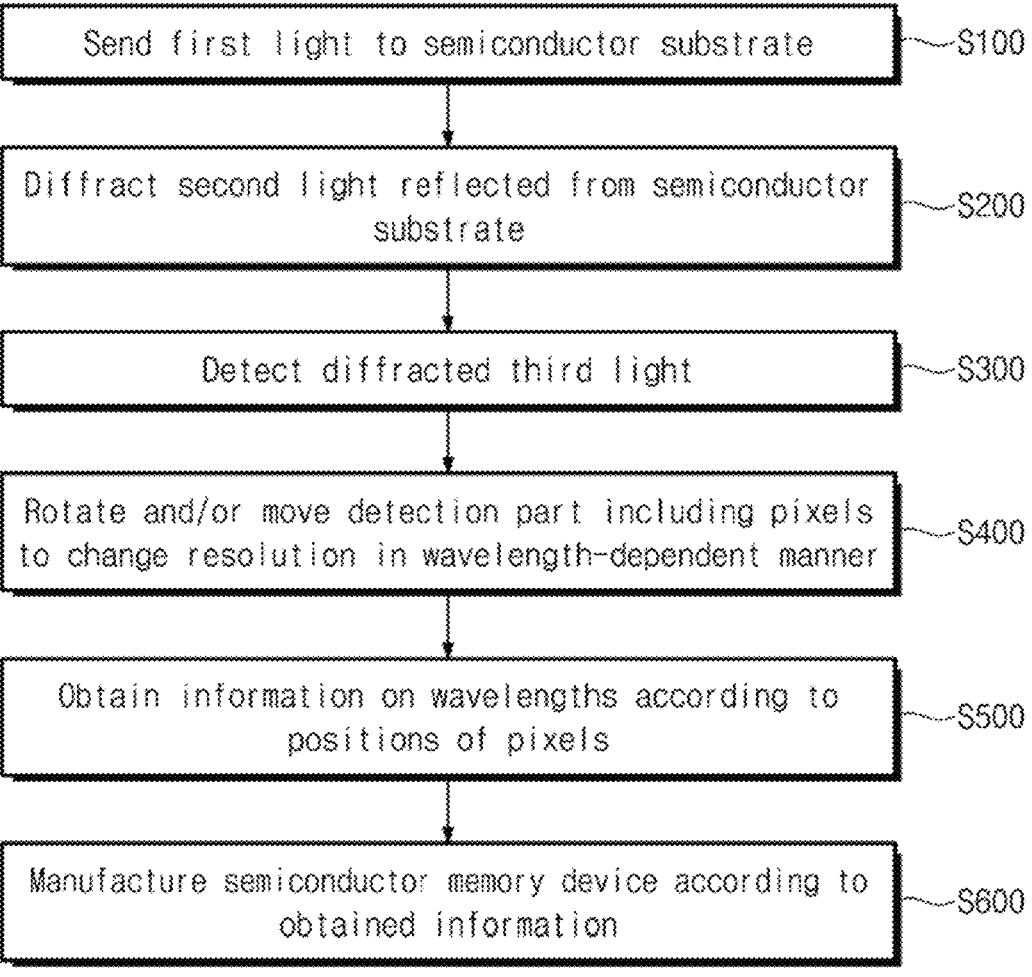

Send first light to semiconductor substrate — S100

Diffract second light reflected from semiconductor substrate — S200

Detect diffracted third light — S300

Rotate and/or move detection part including pixels to change resolution in wavelength-dependent manner — S400

Obtain information on wavelengths according to positions of pixels — S500

Manufacture semiconductor memory device according to obtained information — S600

SPECTROSCOPIC DEVICE, SPECTROSCOPIC METHOD USING THE SAME, AND METHOD OF FABRICATING SEMICONDUCTOR MEMORY DEVICE USING THE SAME

CROSS-REFERENCE TO RELATED APPLICATIONS

This U.S. non-provisional patent application claims priority under 35 U.S.C. § 119 to Korean Patent Application No. 10-2021-0158818, filed on Nov. 17, 2021, in the Korean Intellectual Property Office, the entire contents of which are hereby incorporated by reference.

BACKGROUND

The present inventive concepts relate to spectroscopic devices and spectroscopic methods using the same, and in particular, to spectroscopic devices, which include a light source part including a plurality of auxiliary light sources and a detection part configured to be rotatable and/or movable, spectroscopic methods using the same, and methods of fabricating semiconductor memory devices using the same.

As a particular dimension in a semiconductor process (e.g., a critical dimension, including a size of an element of a semiconductor memory device manufactured according to a semiconductor process that affects the electrical properties of the semiconductor memory device) reduces (e.g., becomes smaller), it becomes increasingly important to develop more precise metrology techniques for the purpose of preventing an accident in a fabrication process, simplifying the fabrication process, reducing a time taken to develop a process, and reducing a production cost. Especially, for semiconductor memory devices fabricated through hundreds of process steps, in-line monitoring techniques, which are using optical, sonic, electric signals allowing fast and non-destructive measurements, are being used to reduce the production cost and to obtain a desired product quality.

An ellipsometry is a technique of sending light to a sample and measuring a change in reflectance and polarization of reflected light. Along with a reflectometry technique of measuring only the reflectance, the ellipsometry is being used to examine optical properties of a material and to measure a thickness of a single or stacked thin film(s).

SUMMARY

Some example embodiments of the inventive concepts provides a spectroscopic device, which is configured to correct a wavelength for each pixel and to control a resolution power based on a wavelength range, a spectroscopic method using the same, and a method of fabricating a semiconductor memory device using the same.

According to some example embodiments of the inventive concepts, a spectroscopic device may include a light source part configured to emit a first light toward a target object, the light source part including a main light source and a plurality of auxiliary light sources, a diffraction part including a diffraction grating configured to diffract a second light that is produced based on the first light being reflected from the target object the diffraction grating configured to produce a third light that is the diffracted second light, a detection part configured to detect the third light, which is diffracted by the diffraction part, and an analyzing part connected to the detection part. The detection part may include a plurality of pixels and an actuator. The plurality of auxiliary light sources may be configured to emit light rays of different wavelengths. The actuator may be configured to rotate and move the detection part.

According to some example embodiments of the inventive concepts, a spectroscopic method may be performed using a spectroscopic device. The spectroscopic device may include a light source part including a main light source and a plurality of auxiliary light sources, a diffraction part including a diffraction grating, a detection part including a plurality of pixels and an actuator, and an analyzing part connected to the detection part. The method may include directing a first light, which is emitted from the light source part, to be incident on a target object such that a second light is reflected from the target object based on the first light being incident on the target object, diffracting the second light reflected from the target object to produce a third light that is the diffracted second light, detecting the third light, rotating and moving the detection part using the actuator to change a resolution per pixel of at least some pixels of the plurality of pixels in a wavelength-dependent manner, and obtaining information on wavelengths according to positions of the pixels of the detection part. The auxiliary light sources may be configured to emit light rays of different wavelengths.

According to some example embodiments of the inventive concepts, a method of fabricating a semiconductor memory device may include forming a mold structure including interlayer dielectric layers and sacrificial layers, which are alternately and repeatedly stacked on a substrate, forming vertical channel holes to penetrate the mold structure, performing a spectroscopic process on the mold structure and the vertical channel holes, forming vertical channel structures in the vertical channel holes, and forming gate electrodes to fill empty spaces, which are formed by selectively removing the sacrificial layers of the mold structure. The spectroscopic process may include directing a first light, which is emitted from a light source part including a main light source and a plurality of auxiliary light sources, to be incident on the mold structure such that a second light is reflected from the mold structure based on the first light being incident on the mold structure, diffracting the second light reflected from the mold structure to produce a third light that is the diffracted second light, detecting the third light, rotating and moving a detection part including an actuator and a plurality of pixels to change a resolution per pixel of at least some pixels of the plurality of pixels in a wavelength-dependent manner, and obtaining information on wavelengths according to positions of the pixels of the detection part based on the rotation and moving of the detection part using the actuator. The auxiliary light sources may be configured to emit light rays of different wavelengths, and the actuator may be used to rotate and move the detection part.

BRIEF DESCRIPTION OF THE DRAWINGS

FIGS. 2A and 2B are conceptual diagrams illustrating a method of operating a spectroscopic device according to some example embodiments of the inventive concepts.

FIG. 3 is a flow chart illustrating a spectroscopic method using a spectroscopic device according to some example embodiments of the inventive concepts.

FIGS. 6A, 7A, 8A, and 9A are plan views illustrating a method of fabricating a semiconductor memory device according to some example embodiments of the inventive concepts.

FIGS. 6B, 7B, 8B, and 9B are sectional views, which are respectively taken along lines A-A' of FIGS. 6A, 7A, 8A, and 9A, respectively, to illustrate a method of fabricating a semiconductor memory device according to some example embodiments of the inventive concepts.

FIGS. 6C, 7C, 8C, and 9C are sectional views, which are respectively taken along lines B-B' of FIGS. 6A, 7A, 8A, and 9A, respectively, to illustrate a method of fabricating a semiconductor memory device according to some example embodiments of the inventive concepts.

DETAILED DESCRIPTION

Figure 1:
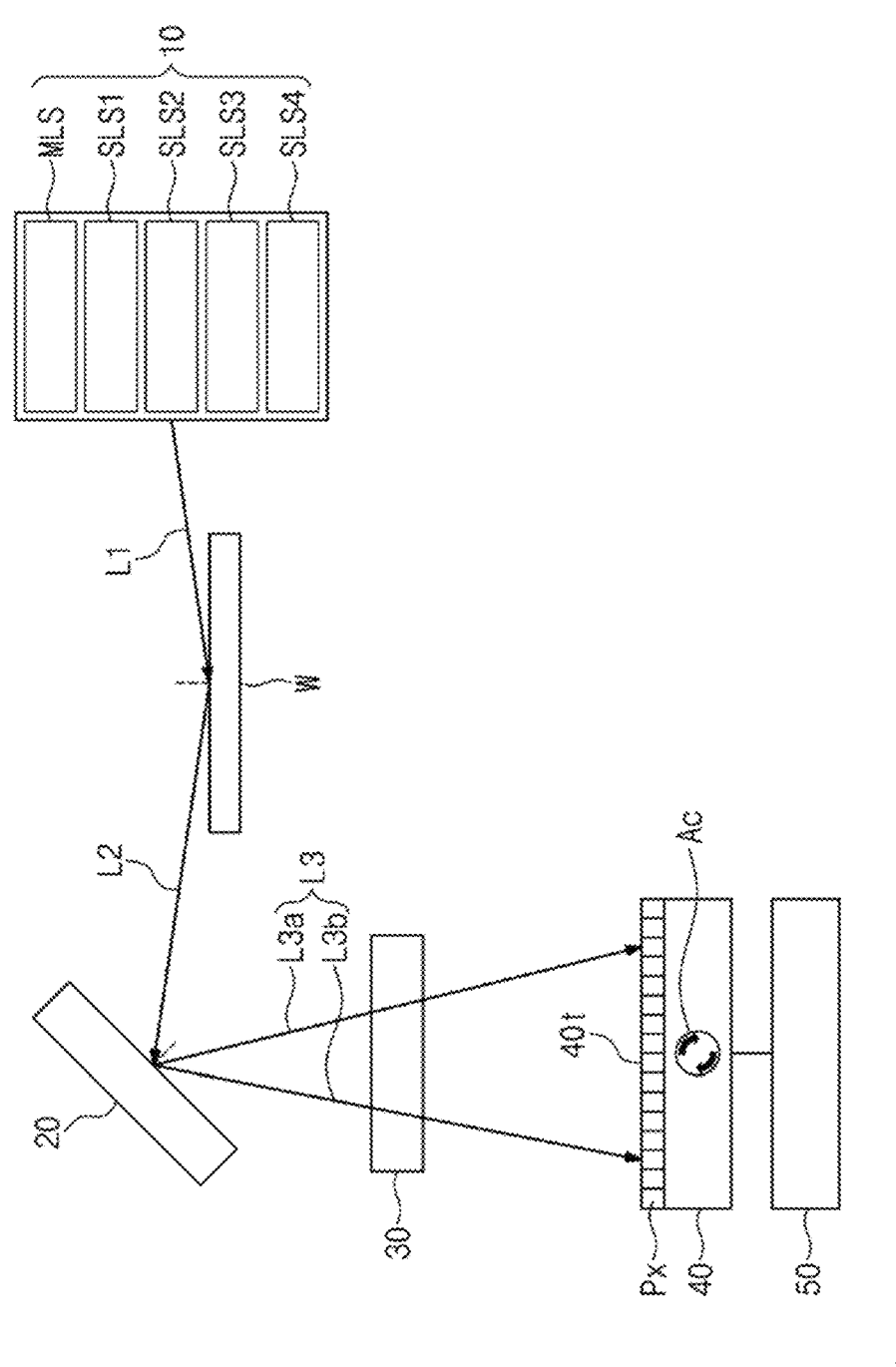
FIG. 1 is a conceptual diagram illustrating a spectroscopic device according to some example embodiments of the inventive concepts.

Some example embodiments of the inventive concepts will now be described more fully with reference to the accompanying drawings, in which some example embodiments are shown.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed "by" performing additional operations, it will be understood that the operation may be performed "based on" the additional operations, which may include performing said additional operations alone or in combination with other further additional operations.

FIG. 1 is a conceptual diagram illustrating a spectroscopic device according to some example embodiments of the inventive concepts.

Referring to FIG. 1, a spectroscopic device according to some example embodiments of the inventive concepts may include a light source part 10, a diffraction part 20, a slit part 30, a detection part 40, and an analyzing part 50.

The light source part 10 may include a main light source MLS and a plurality of auxiliary light sources. For example, the auxiliary light sources may include first to fourth auxiliary light sources SLS1, SLS2, SLS3, and SLS4. Each light source as described herein (e.g., each of the main light source MLS and the plurality of auxiliary light sources, including for example each of the first to fourth auxiliary light sources SLS1, SLS2, SLS3, and SLS4) may be, for example, a light-emitting diode (LED) light source and/or a laser light source. In the present specification, an example, in which four auxiliary light sources are provided, will be described and illustrated, but the inventive concepts are not limited to this example; for example, the spectroscopic device may be configured to have two or more auxiliary light sources. The auxiliary light sources may be used to correct a wavelength for each pixel, and this will be described in more detail with reference to FIG. 4.

The first to fourth auxiliary light sources SLS1, SLS2, SLS3, and SLS4 may be single wavelength light sources which are configured to emit lights of different wavelengths, respectively. Each of the first to fourth auxiliary light sources SLS1, SLS2, SLS3, and SLS4 may be a single wavelength LED light source or a single wavelength laser light source. In some example embodiments, the first to fourth auxiliary light sources SLS1, SLS2, SLS3, and SLS4 may be multi-wavelength light sources, each of which is configured to emit light of two or more wavelengths.

The light source part 10 may be configured to emit a first light L1. The first light L1 may be a combination of lights that are emitted from the main light source MLS and the first to fourth auxiliary light sources SLS1, SLS2, SLS3, and SLS4. In some example embodiments, the first light L1 may be light having a specific wavelength spectrum, not a single wavelength light. In some example embodiments, the wavelength spectrum of the first light L1 may range from about 100 nm to about 1000 nm. However, the wavelength spectrum of the first light L1 is not limited thereto.

The first light L1 emitted from the light source part 10 may be incident into (e.g., incident on) a target object in a spectroscopy process. For example, the target object may be a semiconductor substrate W including a single thin film or stacked thin films. A fraction of the first light L1 may be reflected by the semiconductor substrate W to form (e.g., produce) a second light L2. The second light L2 may be understood to be produced based on the first light L1 being reflected from the target object (e.g., the semiconductor substrate W). Here, the incidence and reflection angles of the second light L2 are not limited to those in the illustrated examples. The second light L2 may contain information on a structure of the semiconductor substrate W. For example, the information on the structure of the semiconductor substrate W may include a thickness of the thin film.

The second light L2, which is reflected from the semiconductor substrate W, may be incident into (e.g., incident on) the diffraction part 20. The diffraction part 20 may be configured to diffract the second light L2. For example, the diffraction part 20 may include a diffraction grating. In some example embodiments, the diffraction part 20 may include a reflective diffraction grating as shown in FIG. 1, but the inventive concepts are not limited to this example; for example, the diffraction part 20 may include a transmissive diffraction grating. The diffraction grating may be configured such that light of a larger wavelength is reflected or diffracted at a larger angle.

A fraction of the second light L2, which is diffracted by the diffraction part 20, may form a third light L3. For example, the diffraction grating of the diffraction part 20 may be configured to diffract at least a portion of the second light L2 and thus may be configured to produce the third light L3 that is the diffracted second light L2. The third light L3 may include a plurality of light rays propagating with different angles to the diffraction part 20. If the incidence angle of the second light L2 is constant, the larger the wavelength of each of the light rays of the third light L3, the larger the reflection angle. For example, the diffraction grating of the diffraction part 20 may be configured to cause the light rays of the diffracted second light L2 to be diffracted at separate, respective angles of diffraction corresponding to respective wavelengths of the light rays, such that the angle of refraction of each light ray of the diffracted second light L2 may be proportional to the respective wavelength of the light ray. More specifically, the second light L2 and the light rays of the third light L3 may satisfy the following Formula 1.

$$h(\sin\theta_1 + \sin\theta_2) = m\lambda, \ m=0,\pm1,\pm2,\pm3,\ \ldots \quad \text{[Formula 1]}$$

where h is a grating distance of the reflective diffraction grating (e.g., a distance in nm), $\theta_1$ is an incidence angle of the second light L2 (e.g., incidence angle in radians), $\theta_2$ is a reflection angle of each of the light rays of the third light L3 (e.g., reflection angle in radians), m is an order of an interference pattern, and $\lambda$ is a wavelength of the diffracted light (e.g., wavelength in nm).

For example, the third light L3 may include a first light ray L3a and a second light ray L3b which have the shorted and longest wavelengths, respectively, within the wavelength spectrum (e.g., within a visible wavelength spectrum). The third light L3 may include a plurality of light rays whose respective wavelengths are between those of the first and second light rays L3a and L3b.

The third light L3, which is diffracted by the diffraction part 20, may pass through the slit part 30 and may be incident into (e.g., incident on) the detection part 40. The slit part 30 may include one or more slits. The slit part 30 may be provided between the diffraction part 20 and the detection part 40 and may be spaced apart from the diffraction part 20 and the detection part 40 in a third direction D3.

The detection part 40 may be configured to detect the third light L3, which is diffracted by the diffraction part 20. The detection part 40 may include a plurality of pixels Px and an actuator Ac. The third light L3 may be incident into the pixels Px of the detection part 40. In some example embodiments, the detection part 40, and/or one or more pixels Px thereof, may include an image sensor such as one or more photoelectric conversion devices (e.g., a CMOS image sensor, a photodiode, an organic CMOS image sensor including an organic photoelectric conversion device, any combination thereof, or the like) which may be configured to detect the third light L3 based on absorbing and photoelectrically converting the detected third light L3 to generate an electrical signal. Each of the pixels Px of the detection part 40 may include a separate photoelectric conversion device or photodiode or a separate portion of a photoelectric conversion device which may each generate a separate electrical signal based on absorbing and photoelectrically converting a portion of the third light L3 that is incident on the pixel into a separate electrical signals, where the electrical signals generated by the pixels of the detection part 40 may be processed to generate corresponding pixels of an image corresponding to the third light L3. Such an image may comprise information on the third light L3. The actuator Ac may be configured to rotate and/or move the detection part 40, as described with reference to FIGS. 2A and 2B. The actuator Ac may include a servoactuator, a mechanical arm that is driven to translate, pivot, and/or rotate by a servoac- tuator, any combination thereof, or the like.

Before (e.g., prior to) a driving operation by the actuator Ac, the detection part 40 may have a top surface 40t (which may correspond to a light-incident surface of one or more image sensors of the detection part 40) that is placed to be parallel to a first direction D1 and a second direction D2 and to be perpendicular to the third direction D3. For example, the first direction D1 and the second direction D2 may be horizontal directions, which are parallel to a ground surface provided with the spectroscopic device according to some example embodiments of the inventive concepts, and the third direction D3 may be a vertical direction, which is normal to the ground surface. In some example embodi- ments, the first to third directions D1, D2, and D3 may be orthogonal to each other. In some example embodiments, the top surface 40t of the detection part 40 may have a curved surface shape.

The detection part 40 may be electrically connected to the analyzing part 50. The analyzing part 50 may be disposed to receive optical signals, which are detected by the pixels Px of the detection part 40, and to perform a process of analyzing the structure of the semiconductor substrate W. The analyzing part 50 may analyze the structure of the semiconductor substrate W based on generating an image of the semiconductor substrate W, based on receiving and/or processing electrical signals generated by the pixels Px of the detection part 40 (e.g., optical signals), where the signals generated by each separate pixel Px may be processed to generate a separate pixel of the image of the semiconductor substrate W. the pixel value (e.g., intensity) of each image pixel may correspond to a wavelength of light detected by the corresponding pixel Px of the detection part 40.

In some example embodiments, the analyzing part 50 may be part of and/or implemented by an electronic device that is configured to control one or more parts of the spectro- scopic device, including for example any of the light source part 10, the diffraction part 20, the detection part 40, the analyzing part 50, any combination thereof, or the like, for example based on generating and transmitting control sig- nals, to cause one or more portions of the spectroscopic device to operate to cause performance of any step or operation of any of the methods according to the example embodiments, including for example some or all operations of any of the methods shown in FIGS. 2A-2B, 3, 4, 5A-5D, 6A-6C, 7A-7C, 8A-8C, 9A-9C, or any combination thereof.

As described herein, any devices, systems, parts, blocks, modules, units, controllers, processors, circuits, apparatus, and/or portions thereof according to any of the example embodiments (including, without limitation, any of the example embodiments of the analyzing part 50, an elec- tronic device including and/or implementing the analyzing part 50, the detection part 40, any portion thereof, or the like) may include, may be included in, and/or may be imple- mented by one or more instances of processing circuitry such as hardware including logic circuits; a hardware/ software combination such as a processor executing soft- ware; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a micro- computer, a field programmable gate array (FPGA), and programmable logic unit, a microprocessor, application- specific integrated circuit (ASIC), a neural network process- ing unit (NPU), an Electronic Control Unit (ECU), an Image Signal Processor (ISP), and the like. In some example embodiments, the processing circuitry may include a non- transitory computer readable storage device (e.g., a memory), for example a solid state drive (SSD), storing a program of instructions, and a processor (e.g., CPU) con- figured to execute the program of instructions to implement the functionality and/or methods performed by some or all of any devices, systems, parts, blocks, modules, units, processors, controllers, circuits, apparatuses, and/or portions thereof according to any of some example embodiments, and/or any portions thereof, including for example some or all operations of any of the methods shown in FIGS. 2A-2B, 3, 4, 5A-5D, 6A-6C, 7A-7C, 8A-8C, 9A-9C, or any com- bination thereof.

Figure 2A:
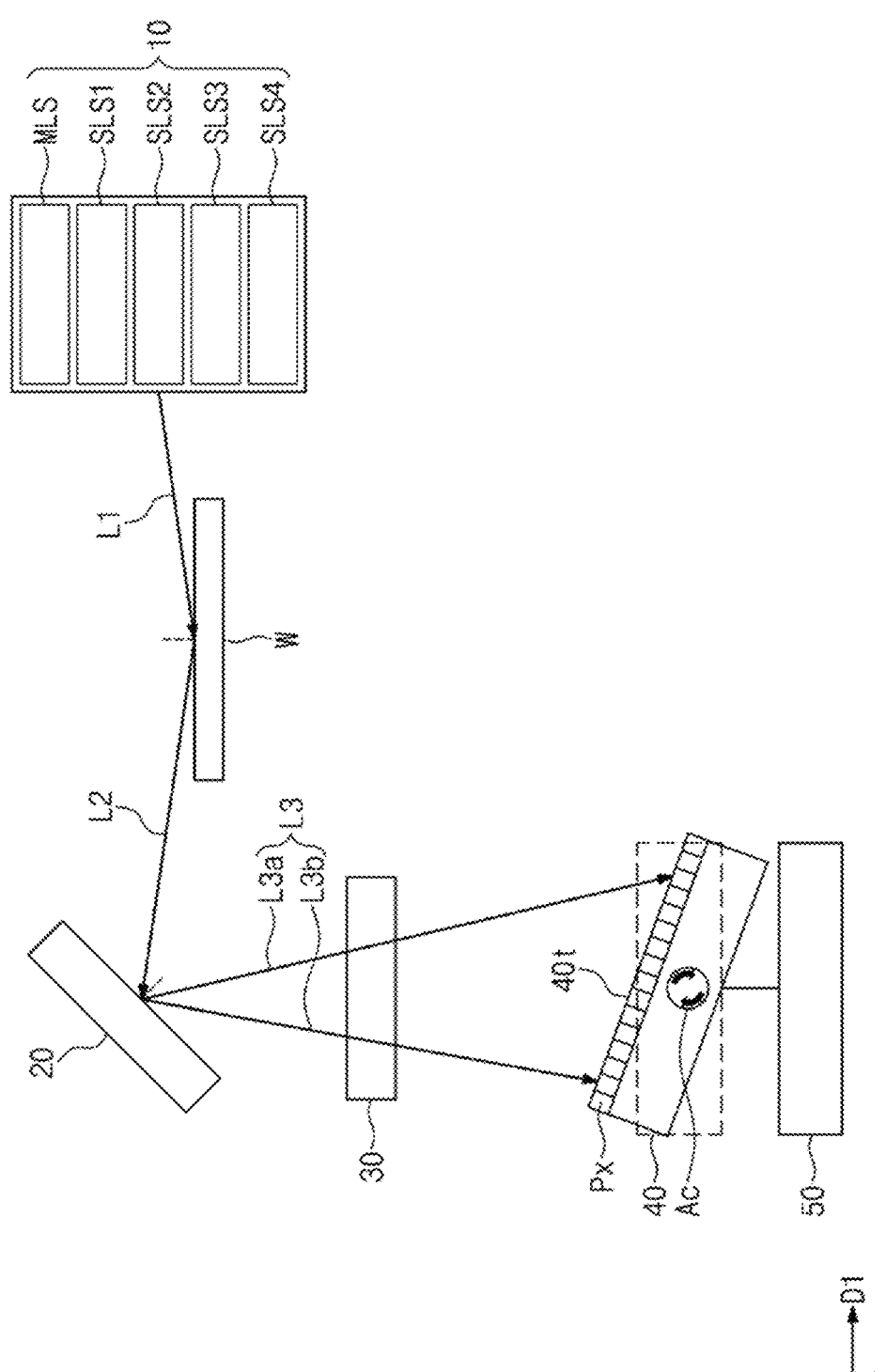
Figure 2B:
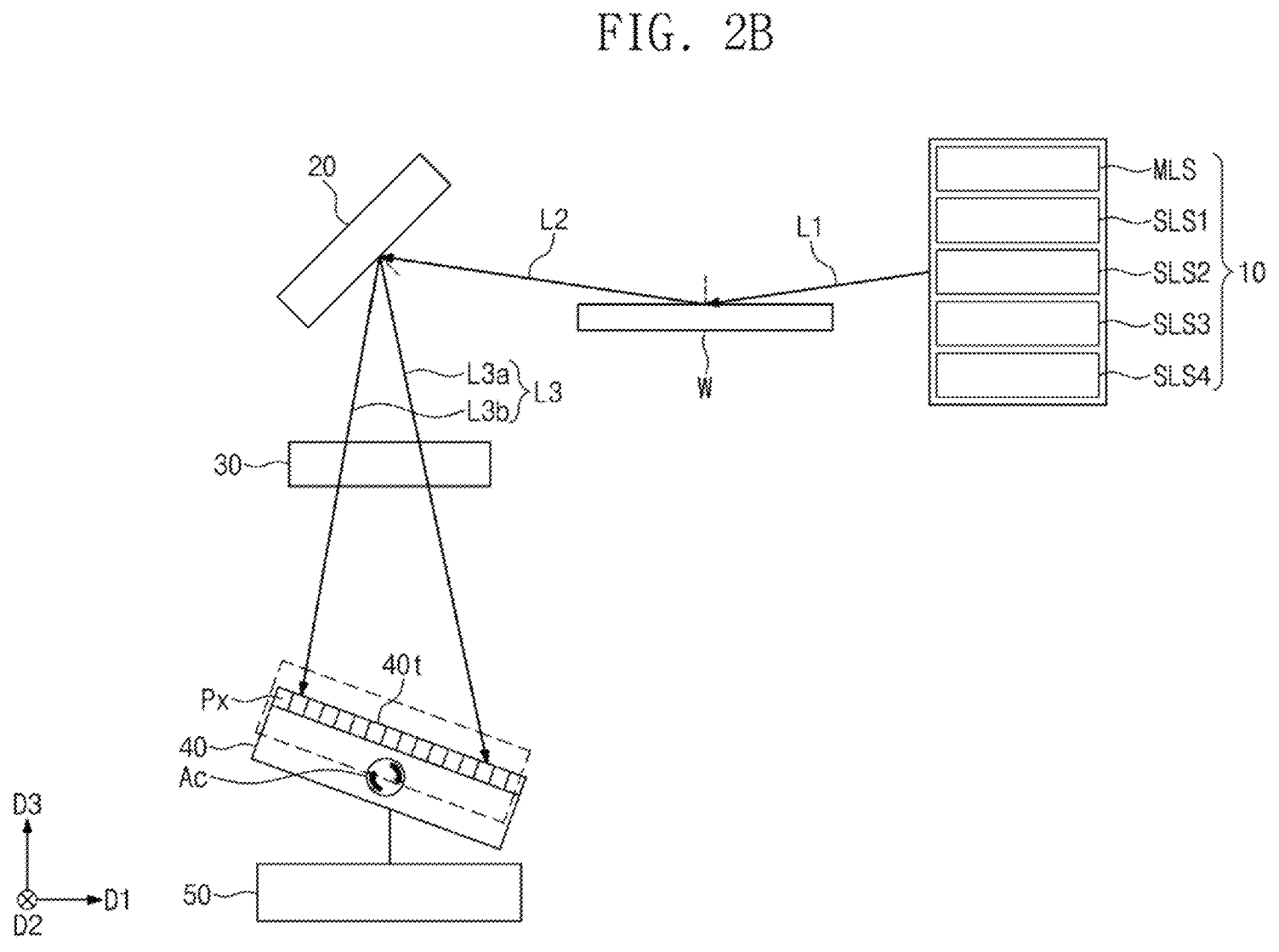

FIGS. 2A and 2B are conceptual diagrams illustrating a method of operating a spectroscopic device according to some example embodiments of the inventive concepts. In the following description, an element previously described with reference to FIG. 1 may be identified by the same reference number without repeating an overlapping descrip- tion thereof, for concise description.

Referring to FIG. 2A, the detection part 40 may be rotated by the actuator Ac. As shown in FIG. 2A, after the rotation, the top surface 40t of the detection part 40 may be inclined at an angle to the third direction D3. The detection part 40 is illustrated to be rotated about an axis parallel to the second direction D2, but the inventive concepts are not limited to this example. For example, the detection part 40 may be rotated about an axis parallel to the first direction D1.

Owing to the rotation of the detection part 40, some of the pixels Px may approach the diffraction part 20 and the slit part 30, and others of the pixels Px may recede from the diffraction part 20 and the slit part 30.

For some of the pixels Px approaching the diffraction part 20 and the slit part 30, a resolution per pixel may be higher after the rotation than before the rotation. The resolution per pixel may mean a change amount of wavelength that is required to distinguish one of the pixels Px and may be expressed in units of nm/pixel. By contrast, for others of the pixels Px receding from the diffraction part 20 and the slit part 30, the resolution per pixel may be lower after the rotation than before the rotation. In other words, a resolution of a pixel Px, to which the first light ray L3a of the third light L3 is incident, may be lower than that of a pixel Px, to which the second light ray L3b of the third light L3 is incident. For example, the actuator Ac may rotate the detection part 40 in a direction inclined to the third direction D3 (which may be a vertical direction) so that at least some of the pixels Px of the detection part 40 may have a position-dependent reso- lution per pixel.

Referring to FIG. 2B, the detection part 40, which is inclined as depicted by FIG. 2A, may be moved (e.g., translated) by the actuator Ac. The detection part 40 may be moved (e.g., translated) in the third direction D3 or in an opposite direction of the third direction D3. A resolution per pixel of the pixels Px may be changed by this movement of the detection part 40 in the third direction D3 or in the opposite direction thereof. In the case where the detection part 40 is moved in the third direction D3, all of the pixels Px may have an increased resolution per pixel based on the movement (e.g., translation) of the detection part 40 in the third direction D3. In the case where the detection part 40 is moved in the opposite direction of the third direction D3, all of the pixels Px may have a decreased resolution per pixel based on the movement (e.g., translation) of the detection part 40 in the opposite direction of the third direction D3.

The detection part 40 may be configured to be movable (e.g., translated) in the first direction D1 and/or the second direction D2. Due to this motion of the detection part 40 in the first and/or second direction D1 and/or D2, the third light L3, which includes the first and second light rays L3*a* and L3*b*, may be incident into a region of the top surface 40*t* of the detection part 40 that is close to a center thereof, and wavelengths of light rays detected by the pixels Px may be shifted.

FIG. 3 is a flow chart illustrating a spectroscopic method using a spectroscopic device according to some example embodiments of the inventive concepts.

Referring to FIGS. 1, 2A, 2B, and 3, the spectroscopic method may include sending (e.g., directing) the first light L1 to the semiconductor substrate W (in S100), diffracting the second light L2 reflected from the semiconductor substrate W (in S200), detecting the diffracted third light L3 (in S300), rotating and/or moving the detection part 40 including the pixels Px to change a resolution in a wavelength-dependent manner (in S400), and obtaining information on wavelengths according to positions of the pixels Px (in S500).

The first light L1, which is incident into the semiconductor substrate W, may be a combination of light rays emitted from the main light source MLS and the first to fourth auxiliary light sources SLS1, SLS2, SLS3, and SLS4 and may be light having a wavelength spectrum. The second light L2, which is reflected from the semiconductor substrate W, may contain information on a structure of the semiconductor substrate W. The information on the structure of the semiconductor substrate W may be obtained from reflectance of the semiconductor substrate W and a change in polarization state before and after the reflection. The third light L3 may include the first light ray L3*a*, which has the smallest wavelength among the wavelength spectrum, the second light ray L3*b*, which has the largest wavelength among the wavelength spectrum, and a plurality of light rays, which have wavelengths between the first and second light rays L3*a* and L3*b*.

The obtaining of the information on the wavelengths according to positions of the pixels Px (in S500) may be performed using the analyzing part 50. The obtaining of the information on the wavelengths according to positions of the pixels Px (in S500) may include correcting a wavelength for each pixel. Such correction for each pixel Px may include, for example, applying the obtained information to Formulas 2 and 3 as described herein to solve for wavelengths for arbitrary pixels. The solved wavelengths for each pixel Px. The corrected wavelength for each pixel Px may be used to generate pixel values of corresponding pixels of an image of the semiconductor substrate W that is generated based on the optical signals generated by the pixels Px (e.g., as the pixel value of the image pixel corresponding to the pixel Px). Accordingly, a wavelength-corrected image of the semiconductor substrate W may be generated. Such a wavelength-corrected image may provide improved resolution of objects visible in the image, enabling improved accuracy and/or precision of measurements of the imaged objects and/or structures (e.g., measurements of one or more dimensions thereof).

At S600, the information on wavelengths may be used (e.g., based on measuring dimensions of structures of the semiconductor substrate W imaged in the wavelength-corrected image) to determine whether to selectively manufacture a semiconductor memory device based on the imaged semiconductor substrate W, for example based on measuring structures visible in the wavelength-corrected images and determining whether a dimension of one or more of the structures meets a threshold value. If not, a process defect in the semiconductor substrate W may be determined to be present, and the semiconductor substrate may be selectively forwarded to a refurbishment/repair process to correct the process defect or to a discard operation to discard the semiconductor substrate W from the manufacturing process, thereby precluding the process defect from being present in a manufactured semiconductor device. If so, the semiconductor substrate WM may be determined to not include process defects and may be selectively forwarded to a further manufacturing process to manufacture a semiconductor memory device based on the semiconductor substrate W.

Figure 4:
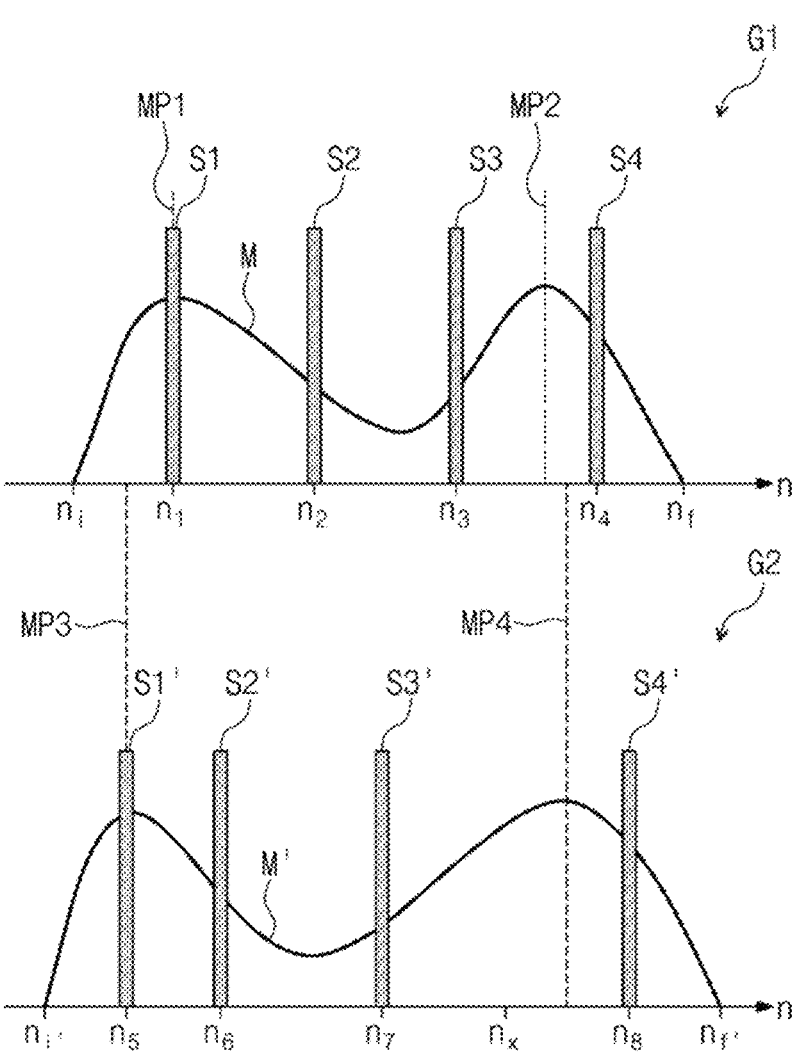
FIG. 4 is a graph that is presented to illustrate a step of correcting a wavelength according to a position of a pixel, which is performed during a spectroscopic method using a spectroscopic device according to some example embodiments of the inventive concepts.

FIG. 4 is a graph that is presented to illustrate a step of correcting a wavelength according to a position of a pixel, which is performed during a spectroscopic method using a spectroscopic device according to some example embodiments of the inventive concepts.

In FIG. 4, a first graph G1 shows a curve of optical signals measured from the pixels Px (e.g., electrical signals generated by the pixels Px based on detecting, for example absorbing and photoelectrically converting, incident third light L3) before rotating the detection part 40 (i.e., when the resolution per pixel has substantially the same value at all of the pixels Px), and a second graph G2 shows a curve of optical signals measured from the pixels Px after rotating the detection part 40 (i.e., when the resolution per pixel has different values depending on positions of the pixels Px). In the first and second graphs G1 and G2, the horizontal axis represents a pixel number (n) given for each of the pixels Px arranged in the first direction D1. The pixel number (n) given for each of the pixels Px may be a natural number increasing in the first direction D1. The larger the pixel number (n), the smaller the wavelength of the signal measured from the pixel Px.

The first graph G1 may include a main signal M and first to fourth auxiliary signals S1, S2, S3, and S4 generated by the main light source MLS and the first to fourth auxiliary light sources SLS1, SLS2, SLS3, and SLS4, respectively. The main signal M may be measured from i-th to f-th pixels $n_f$ to $n_f$ (f>i) and may have first and second peaks MP1 and MP2.

The first auxiliary signal S1 may be measured from a first pixel $n_1$ and may have a first wavelength ($\lambda_1$). The second auxiliary signal S2 may be measured from a second pixel $n_2$ and may have a second wavelength ($\lambda_2$). The second wavelength ($\lambda_2$) may be smaller than the first wavelength ($\lambda_1$). The third auxiliary signal S3 may be measured from a third pixel $n_3$ and may have a third wavelength ($\lambda_3$). The third wavelength ($\lambda_3$) may be smaller than the second wavelength ($\lambda_2$). The fourth auxiliary signal S4 may be measured from a fourth pixel $n_4$ and may have a fourth wavelength ($\lambda_4$). The fourth wavelength ($\lambda_4$) may be smaller than the third wavelength ($\lambda_3$). For example, the first to fourth pixels $n_1$, $n_2$, $n_3$, and $n_4$ may be spaced apart from each other by the same distance.

In some example embodiments, the first peak MP1 of the main signal M may have substantially the same wavelength as the first auxiliary signal S1, and the second peak MP2 of the main signal M may have a wavelength that is smaller than the third auxiliary signal S3 and is larger than the fourth auxiliary signal S4. However, the inventive concepts are not limited to this example.

The second graph G2 may include deformed signals (e.g., a deformed main signal M' and deformed first to fourth auxiliary signals S1', S2', S3', and S4') measured after the rotation of the detection part 40. The deformed main signal M' may be measured from i'-th to f-th pixels to $n_f'$ (f>i') and may include third and fourth peaks MP3 and MP4. The third peak MP3 may be placed at a position shifted from the first peak MP1 in a left direction (i.e., in the opposite direction of the first direction D1). The fourth peak MP4 may be placed at a position shifted from the second peak MP2 in a right direction (i.e., in the first direction D1), but the inventive concepts are not limited to this example.

The first auxiliary signal S1' having the first wavelength ($\lambda$) may be measured at a fifth pixel $n_5$, not at the first pixel $n_1$. The second auxiliary signal S2' having the second wavelength ($\lambda_2$) may be measured at a sixth pixel $n_6$, not at the second pixel $n_2$. The third auxiliary signal S3' having the third wavelength ($\lambda_3$) may be measured at a seventh pixel $n_7$, not at the third pixel $n_3$. The fourth auxiliary signal S4' having the fourth wavelength ($\lambda_4$) may be measured at an eighth pixel $n_8$, not at the fourth pixel $n_4$. The fifth to seventh pixels $n_5$, $n_6$, and $n_7$ may be respectively placed at positions shifted from the first to third pixels $n_1$, $n_2$, and $n_3$ in the left direction (i.e., in the opposite direction of the first direction D1), and the eighth pixel $n_8$ may be placed at a position shifted from the fourth pixel $n_4$ in the right direction (i.e., in the first direction D1). However, the inventive concepts are not limited to this example; for example, distances between the fifth to eighth pixels $n_5$, $n_6$, $n_7$, and $n_8$ may be different from each other.

After rotating the detection part 40 (i.e., when the resolution per pixel has different values depending on positions of the pixels Px), a wavelength of a signal for each of the pixels Px (e.g., a wavelength of incident light on the pixels Px as indicated by electrical signals generated by the pixels Px) may be given as a cubic function equation that is expressed in terms of a pixel number of the pixel. Here, a wavelength ($\lambda_x$), for example in units of nm, of a signal measured from an x-th pixel $n_x$ (f'>x>i') may be calculated by solving a system of equations (e.g., cubic function equations), which are given by the following Formula 2, to obtain four coefficients $a_0$, $a_1$, $a_z$, and $a_3$ and then substituting $n_x$ into a cubic function equation with known coefficients as given by the following Formula 3. In other words, after the rotation of the detection part 40, the obtaining of the information on the wavelengths according to positions of the pixels Px (in S500 of FIG. 3) may be performed using the analyzing part 50 based on solving for Formulas 2 and 3, which may include, as shown in Formula 2, representative wavelengths of respective signals obtained from respective pixels of the pixels (e.g., $\lambda_1$, $\lambda_2$, $\lambda_3$, and $\lambda_4$) as a function equation of respective pixel numbers of the pixels (e.g., a cubic function equation having coefficients $a_0$, $a_1$, $a_2$, and $a_3$ and the respective pixel numbers as the variable, such that the obtained wavelength of a signal obtained from a given pixel equals the cubic function equation when the respective pixel number of the given pixel is the variable), calculating the respective values of the coefficients through auxiliary signals of the auxiliary light sources, and then substituting a pixel number of the arbitrary pixel in the function equation (e.g., as shown at Formula 3).

$$\begin{cases} \lambda_1 = f(n_5) = a_0 + a_1 n_5 + a_2 n_5^2 + a_3 n_5^3 \\ \lambda_2 = f(n_6) = a_0 + a_1 n_6 + a_2 n_6^2 + a_3 n_6^3 \\ \lambda_3 = f(n_7) = a_0 + a_1 n_7 + a_2 n_7^2 + a_3 n_7^3 \\ \lambda_4 = f(n_8) = a_0 + a_1 n_8 + a_2 n_8^2 + a_3 n_8^3 \end{cases} \quad \text{[Formula 2]}$$

$$\lambda_x = f(n_x) = a_0 + a_1 n_x + a_2 n_x^2 + a_3 n_x^3 \quad \text{[Formula 3]}$$

In the case where a wavelength of a signal for a pixel whose pixel number is n is given by a m-th order function equation, the number of the auxiliary light sources, which are required to correct a wavelength for each pixel, may be (m+1), where m is a natural number. In some example embodiments, the spectroscopic device includes four auxiliary light sources and thus the wavelength correction for each pixel is performed using four data, but the inventive concepts are not limited to this example.

To sum up, according to some example embodiments of the inventive concepts, by performing the step of obtaining the information on the wavelengths according to positions of the pixels Px (in S500 of FIG. 3) after the rotation and/or movement of the detection part 40, it may be possible to quickly correct a wavelength for each pixel, which may be used to generate a wavelength-corrected image of the imaged target object (e.g., semiconductor substrate W) without an additional step of aligning elements. As a result, operating efficiency, speed, and/or performance, and thus functionality, of an electronic device implementing at least the analyzing part 50 to perform the wavelength correction and to generate a wavelength corrected image of the target object may be improved, and thus the spectroscopic device may be caused to have improved performance and thus improved functionality, based on the spectroscopic device being configured to enable the spectroscopic method as shown in at least FIG. 3 to be performed, including the operation in S500 in FIG. 3 to improve the speed of wavelength correction and generation of a wavelength-corrected image where a step of aligning elements is omitted, thereby enabling an increase in operation speed of the spectroscopic device. Additionally, due to being configured to omit the alignment step, the spectroscopic device may be configured to have reduced structural and/or operational complexity, thereby improving spectroscopic device reliability. It will be understood that such improved functionality and operation performance of the spectroscopic device may be based at least in part upon the spectroscopic device including the light source part including the main light source and the plurality of auxiliary light sources, the actuator configured to rotate and move the detection part, and the spectroscopic device being configured to rotate and move the detection part, obtain signals from the detection part corresponding to different positions of the detection part, concurrently with the detection part detecting light at least partially based on light from the main light source and the auxiliary light sources being reflected off of a target object and diffracted and directed to the detection part, and process such signals at the analyzing part to perform wavelength correction and generate a wavelength-corrected image of the target object.

FIGS. 5A to 5D are graphs which are presented to illustrate a step of controlling a resolution based on a wavelength range, which is performed during in a spectroscopic method using a spectroscopic device according to some example embodiments of the inventive concepts. More specifically, FIGS. 5A to 5D are graphs showing reflectance versus wavelength.

As depicted in FIGS. 5A to 5D, each of the graphs may include a first wavelength range WLR1 and a second wavelength range WLR2. For example, the first wavelength range WLR1 may be a wavelength range from about 200 nm to about 500 nm, and the second wavelength range WLR2 may be a wavelength range from about 500 nm to about 900 nm. Signals of high frequency may be mainly found in the first wavelength range WLR1 than in the second wavelength range WLR2.

Figures 5A, 5B:
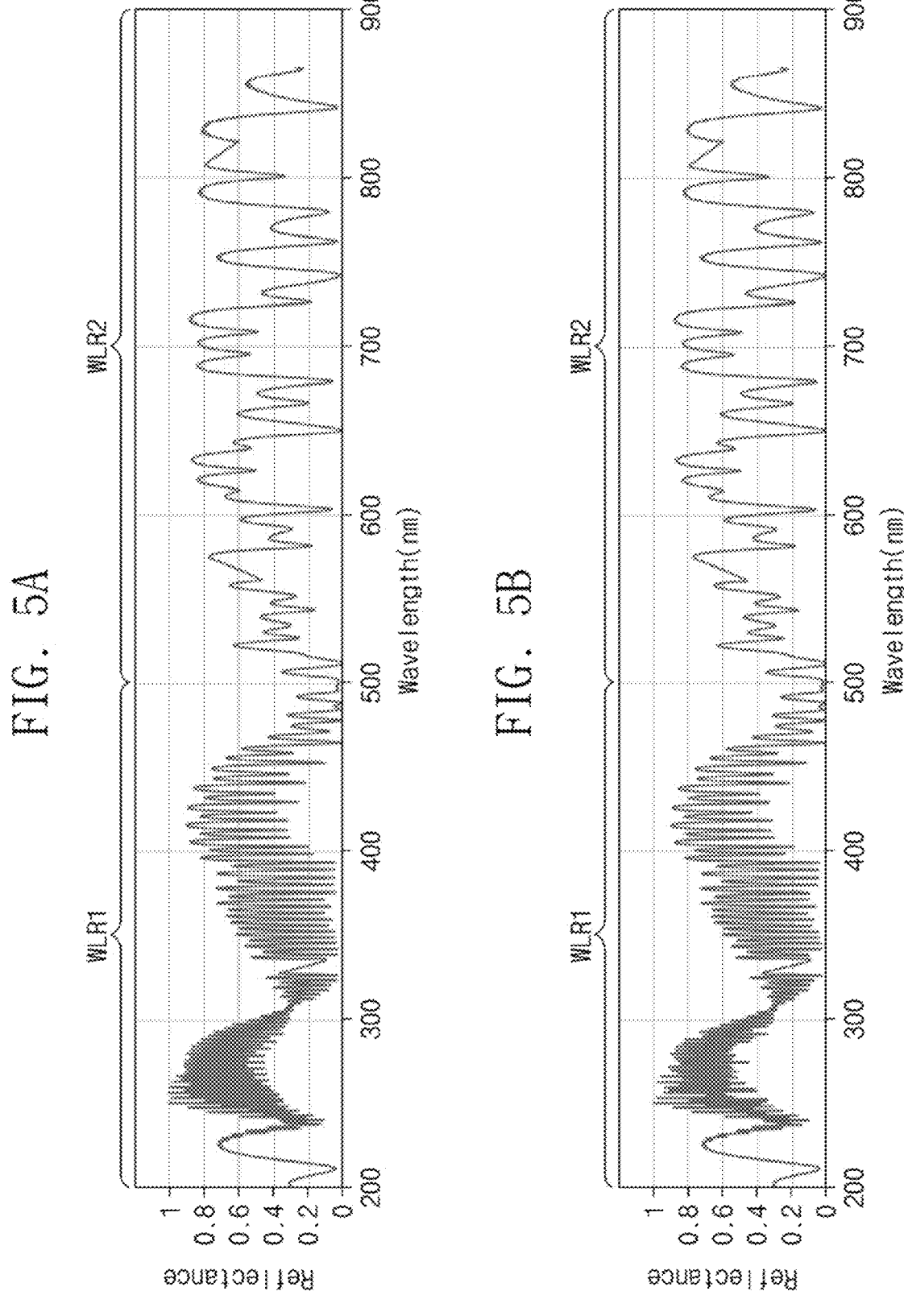
FIGS. 5A, 5B, 5C, and 5D are graphs which are presented to illustrate a step of controlling a resolution based on a wavelength range, which is performed during in a spectroscopic method using a spectroscopic device according to some example embodiments of the inventive concepts.
Figures 5C, 5D:
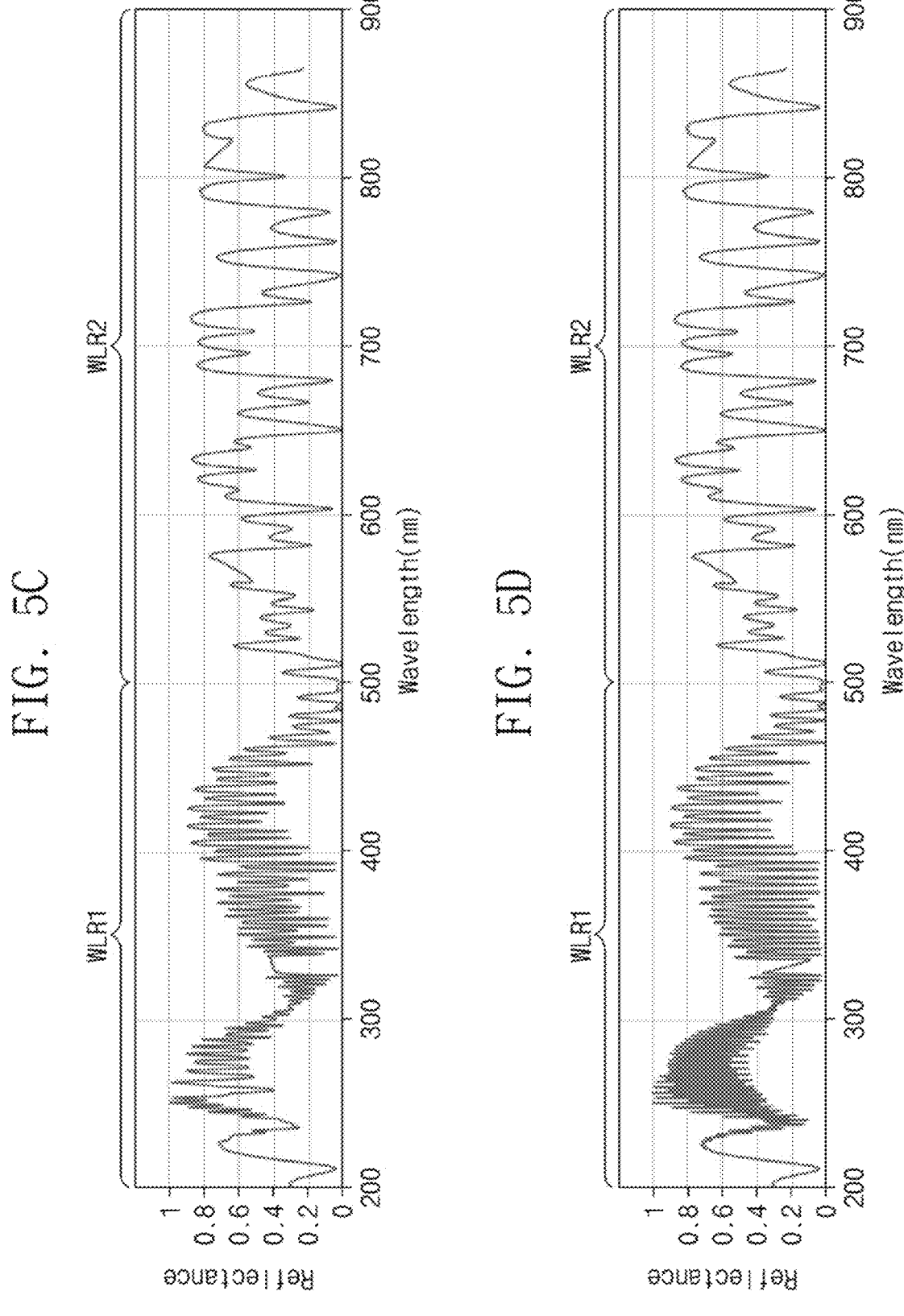

FIGS. 5A to 5C are graphs of reflectance data measured before the rotation of the detection part 40 (i.e., when the resolution per pixel has substantially the same value at all of the pixels Px).

More specifically, FIG. 5A is a reflectance graph measured when the resolution per pixel is about 0.35 nm/pixel at all of the pixels Px. FIG. 5B is a reflectance graph measured when the resolution per pixel is about 0.65 nm/pixel at all of the pixels Px. FIG. 5C is a reflectance graph measured when the resolution per pixel is about 1.3 nm/pixel at all of the pixels Px.

Meanwhile, FIG. 5D is a reflectance graph measured after the rotation of the detection part 40 (i.e., when the resolution per pixel has different values depending on positions of the pixels Px). Here, a resolution of a pixel Px, to which the first light ray L3*a* is incident, may be about 0.35 nm/pixel, and a resolution of a pixel Px, to which the second light ray L3*b* is incident may be about 1.3 nm/pixel.

Comparing FIGS. 5B and 5C with FIG. 5A, the spectrums of FIGS. 5B and 5C may be partly lost in the first wavelength range WLR1, because a resolution margin is short in the first wavelength range WLR1 unlike the second wavelength range WLR2.

Comparing FIG. 5D with FIG. 5A, the reflectance graph of FIG. 5D obtained after the rotation of the detection part 40 may substantially coincide with the reflectance graph of FIG. 5A measured when the resolution per pixel is about 0.35 nm/pixel at all of the pixels Px. This is because a resolution margin for each of the first and second wavelength ranges WLR1 and WLR2 is satisfied by changing a resolution in a wavelength-dependent manner (in S400 of FIG. 3).

To sum up, according to some example embodiments of the inventive concepts, even if a resolution per pixel for all of the pixels Px is not lowered, the accuracy of measurement may be improved by changing a resolution in a wavelength-dependent manner (in S400 of FIG. 3).

As a result, the spectroscopic device according to some example embodiments, may be configured to enable and/or perform measurements of a target object with improved accuracy, and to thereby generate measurement results having improved accuracy with regard to the actual dimensions of the measured structures of the target object based on the spectroscopic device having, e.g., the light source part, the detection part, the actuator configured to rotate and move the detection part, the analyzing part configured to obtain signals from pixels of the detection part when the detection part is at different rotations and/or positions and obtain information on wavelengths of the pixels as described herein, or any combination thereof.

Accordingly, the functionality of the spectroscopic device with regard to measuring structures of the target object based on processing information obtained from the detection part may be improved in accuracy. The spectroscopic device may be improved to be configured to generate measurements with improved accuracy and/or precision and thus to provide more reliable measurements of dimensions of the actual structure of the target object. For example, the spectroscopic device may, based on being configured to provide improved images enabling accuracy of measurement of imaged structures, may have improved ability to detect defects in a structure of the target device, and thereby may improve an ability to detect process defects in a manufactured device and to selectively process the target device based on whether such process defects are detected (e.g., selectively forward the target device to a refurbishment, repair, or discarding operation in response to detecting a process defect in the target object and/or selectively forward the target device to a manufacturing operation to incorporate at least a portion of the target device into a further manufactured device such as an electronic device, based on processing information obtained from the detection part, where such information may include optical signals and/or images of the target object where the wavelengths of pixels of the images are wavelength-corrected according to operations as described herein). Where the spectroscopic device and/or spectroscopic method performed based on operating the spectroscopic device enables improved accuracy of detection of process defects in structures of target devices, the frequency of such defects being included in manufactured devices (e.g., electronic devices) that include at least a portion of the target devices may be reduced, thereby improving operational performance and/or reliability of such manufactured devices.

FIGS. 6A, 7A, 8A, and 9A are plan views illustrating a method of fabricating a semiconductor memory device according to some example embodiments of the inventive concepts. FIGS. 6B, 7B, 8B, and 9B are sectional views, which are respectively taken along lines A-A' of FIGS. 6A, 7A, 8A, and 9A, respectively, to illustrate a method of fabricating a semiconductor memory device according to some example embodiments of the inventive concepts. FIGS. 6C, 7C, 8C, and 9C are sectional views, which are respectively taken along lines B-B' of FIGS. 6A, 7A, 8A, and 9A, respectively, to illustrate a method of fabricating a semiconductor memory device according to some example embodiments of the inventive concepts.

Hereinafter, a method of fabricating a semiconductor memory device according to some example embodiments of the inventive concepts will be described in more detail with reference to FIGS. 6A to 9C.

Figure 6A:
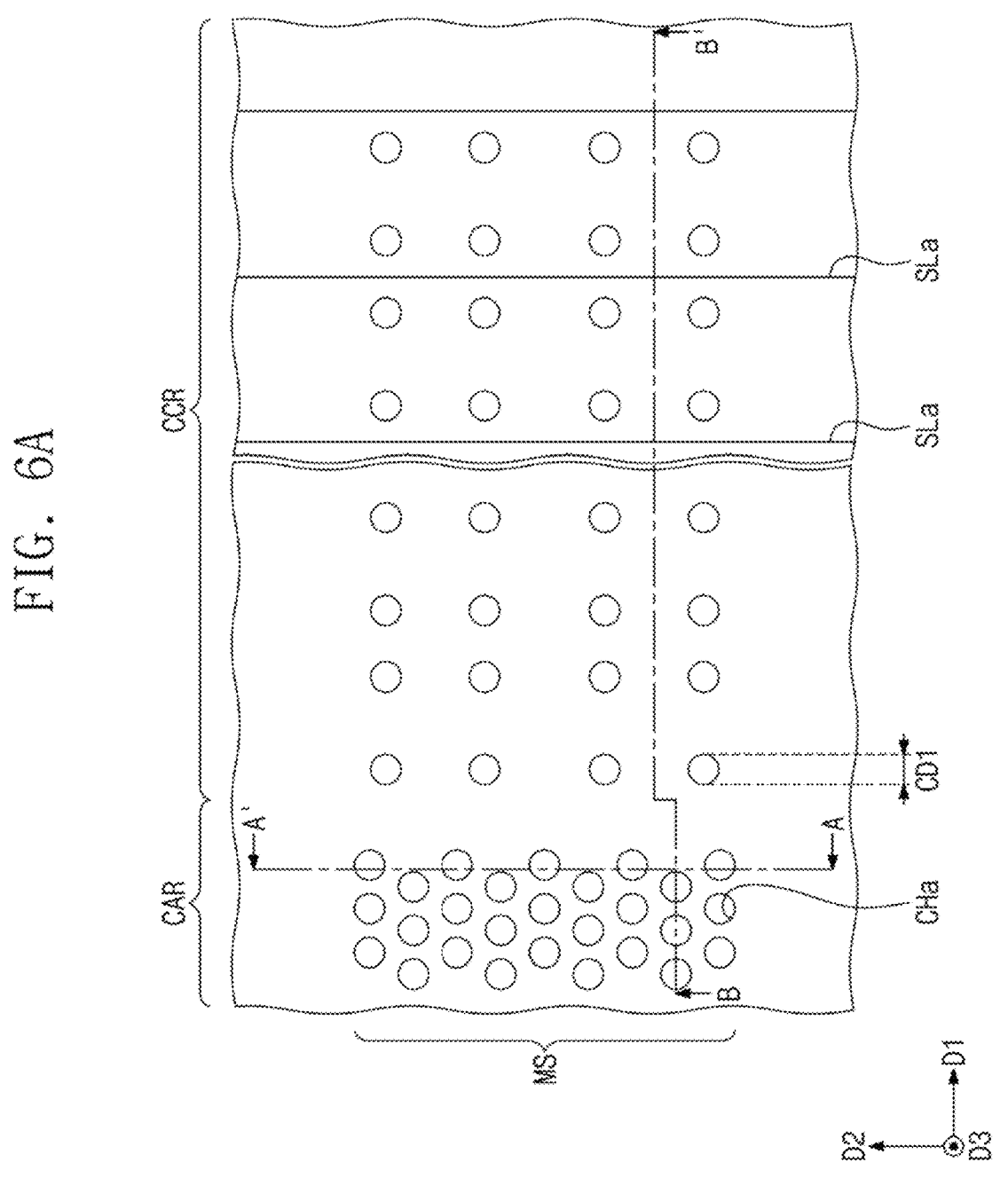
Figure 6B:
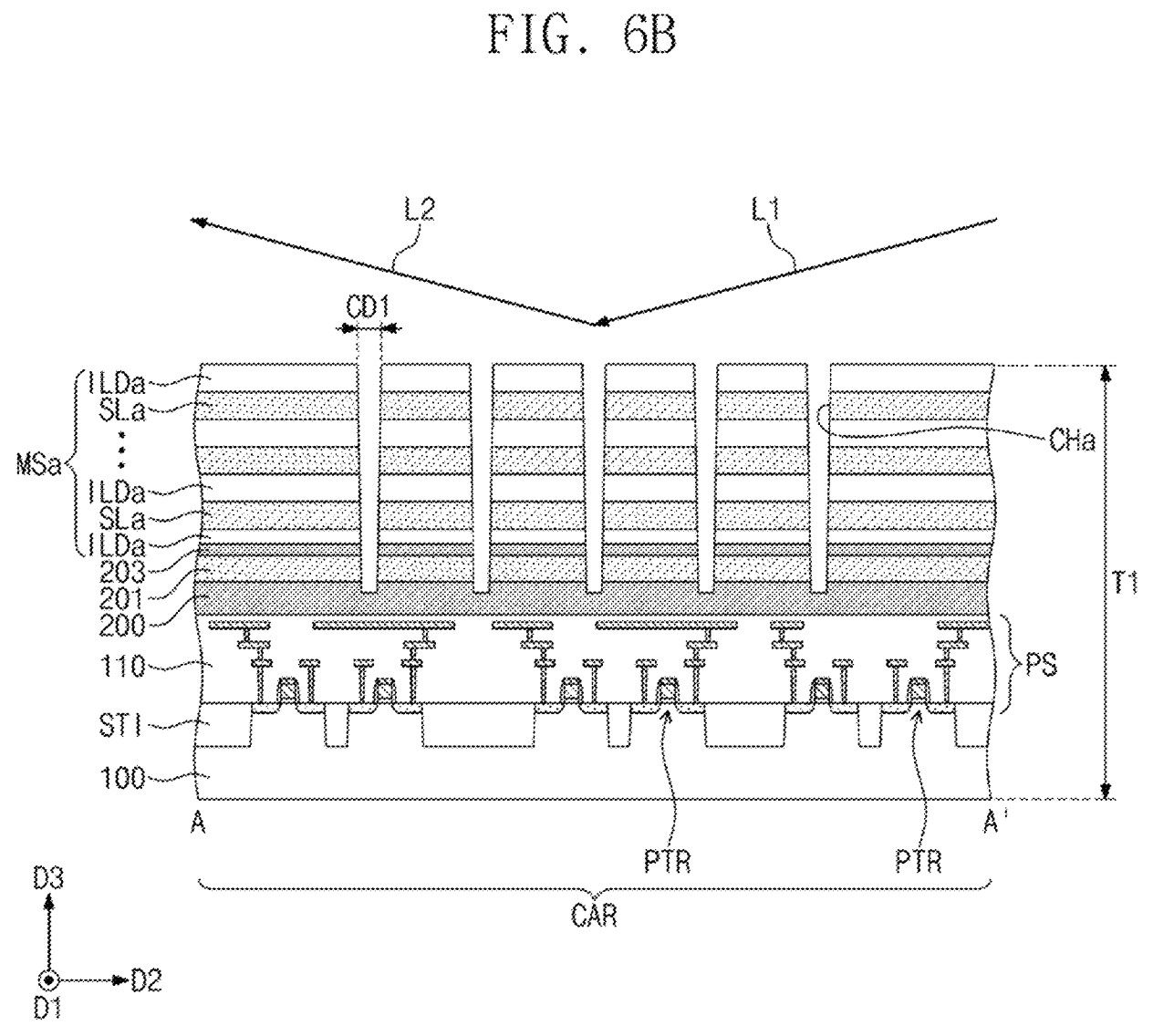
Figure 6C:
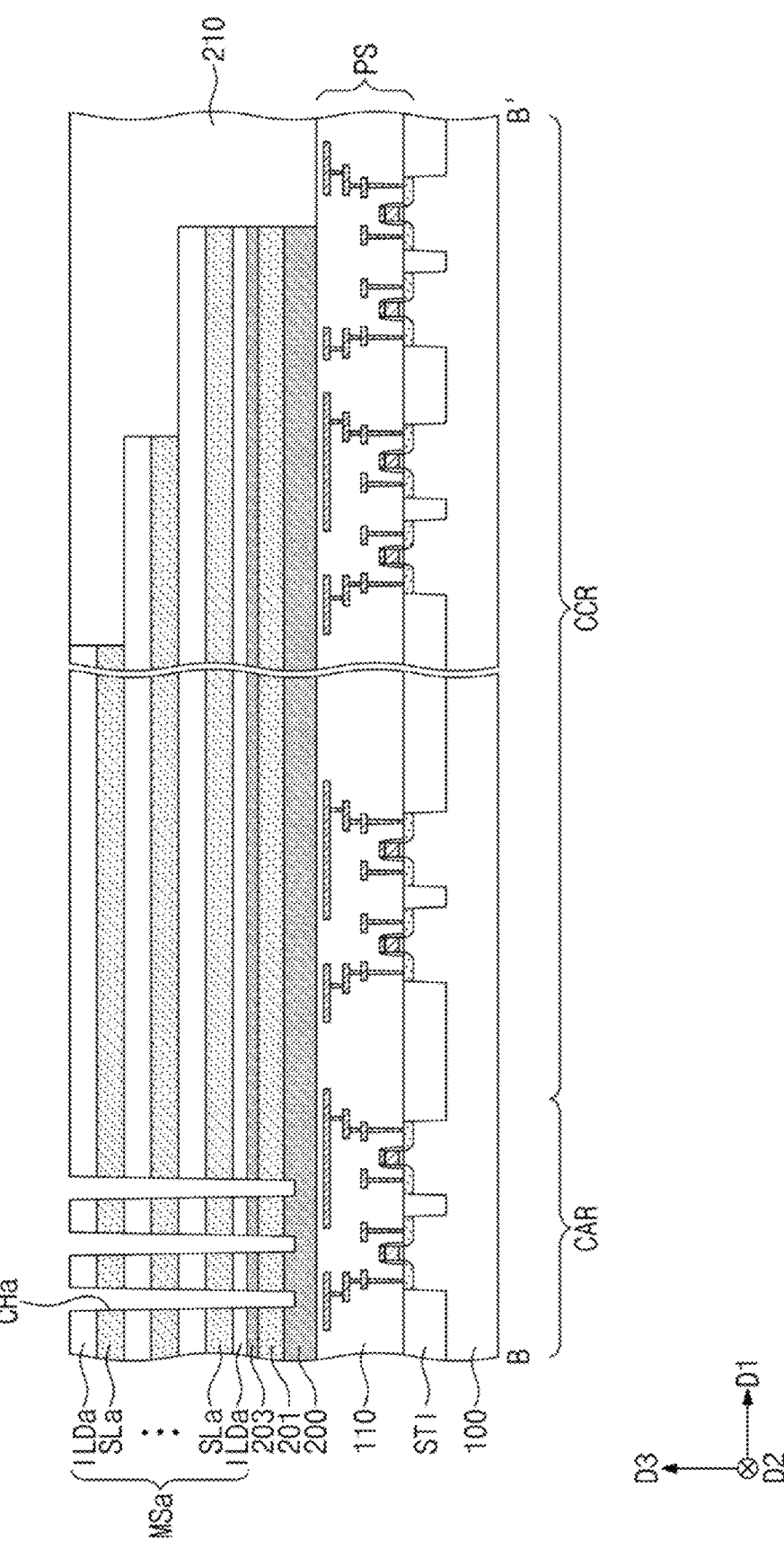

Referring to FIGS. 6A, 6B, and 6C, a first substrate 100 including a cell array region CAR and a contact region CCR may be provided. The contact region CCR may be extended from the cell array region CAR in a first direction D1. The first substrate 100 may be extended not only in the first direction D1 from the cell array region CAR toward the contact region CCR but also in a second direction D2 crossing the first direction D1. In some example embodiments, a top surface of the first substrate 100 may be parallel to the first direction D1 and the second direction D2 and may be perpendicular to a third direction D3.

The first substrate 100 may be a semiconductor substrate. For example, the first substrate 100 may be a silicon substrate, a silicon germanium substrate, a germanium substrate, or a single-crystalline epitaxial layer grown on a single-crystalline silicon substrate.

A device isolation layer STI may be formed in the first substrate 100 to define an active region. The formation of the device isolation layer STI may include forming a trench in an upper portion of the first substrate 100 and filling the trench with a silicon oxide layer.

A peripheral circuit structure PS including peripheral circuit transistors PTR may be formed on the first substrate 100 and the device isolation layer STI. More specifically, the peripheral circuit transistors PTR may be formed on an active region defined by the device isolation layer STI. Peripheral circuit contact plugs and peripheral circuit interconnection lines may be formed to be electrically connected to source/drain regions of the peripheral circuit transistors PTR. A first insulating layer 110 may be formed to cover the peripheral circuit transistors PTR, the peripheral circuit contact plugs, and the peripheral circuit interconnection lines. The first insulating layer 110 may be formed to have a multi-layered structure including a plurality of insulating layers. In some example embodiments, the first insulating layer 110 may be formed of or include at least one of silicon oxide, silicon nitride, silicon oxynitride, and/or low-k dielectric materials.

A second substrate 200, a lower sacrificial layer 201, and a lower semiconductor layer 203 may be sequentially formed on the first insulating layer 110. The lower sacrificial layer 201 may be formed of or include silicon nitride. In some example embodiments, the lower sacrificial layer 201 may be formed by sequentially stacking a plurality of insulating layers (e.g., a plurality of oxide layers and at least one nitride layer therebetween). In some example embodiments, the lower semiconductor layer 203 may be formed of or include the same material as the second substrate 200.

A first mold structure MSa may be formed on the lower semiconductor layer 203. The formation of the first mold structure MSa may include alternately and repeatedly stacking first interlayer dielectric layers ILDa and first sacrificial layers SLa on the lower semiconductor layer 203 and performing a first trimming process on the first interlayer dielectric layers ILDa and the first sacrificial layers SLa.

The first sacrificial layers SLa may be formed of or include a material having an etch selectivity with respect to the first interlayer dielectric layers ILDa. For example, the first interlayer dielectric layers ILDa may be formed of or include silicon oxide, and the first sacrificial layers SLa may be formed of or include silicon nitride.

The first trimming process may include forming a mask pattern to cover a top surface of the uppermost one of the first interlayer dielectric layers ILDa, patterning some of the first interlayer dielectric layers ILDa and the first sacrificial layers SLa using the mask pattern as an etching mask, reducing an area of the mask pattern, and patterning others of the first interlayer dielectric layers ILDa and the first sacrificial layers SLa using the reduced mask pattern as an etching mask. The step of reducing the area of the mask pattern and the patterning step may be alternately repeated. As a result of the first trimming process, the first mold structure MSa may have a staircase structure.

First vertical channel holes CHa may be formed to penetrate the first mold structure MSa (i.e., the first interlayer dielectric layers ILDa and the first sacrificial layers SLa), the lower sacrificial layer 201, and the lower semiconductor layer 203. The first vertical channel holes CHa may be formed on the cell array region CAR. The first vertical channel holes CHa on the cell array region CAR may be arranged in the first and second directions D1 and D2 to form a zigzag arrangement, when viewed in the plan view of FIG. 6A. In some example embodiments, some of the first vertical channel holes CHa may be formed on the contact region CCR. The first vertical channel holes CHa on the contact region CCR may be arranged in the first direction D1, when viewed in the plan view of FIG. 6A.

As a height in the third direction D3 increases, widths of the first vertical channel holes CHa measured in the first and second directions D1 and D2 may increase. An upper diameter of each of the first vertical channel holes CHa may be defined as a first particular dimension CD1 (e.g., a first critical dimension, including a size of a first element of a semiconductor memory device where the size of the first element affects the electrical properties of the semiconductor memory device).

Referring back to FIGS. 1 and 3, after the formation of the first vertical channel holes CHa, a first spectroscopic process may be performed (e.g., performing some or all of steps S100 to S600 shown in FIG. 3 on the device shown in FIGS.

6A to 6C), and in some example embodiments, the first spectroscopic process may include sending a first light L1 from the light source part 10 toward a top surface of the first mold structure MSa (in S100), diffracting a second light L2, which is reflected from the top surface of the first mold structure MSa, using a diffraction part 20 (in S200), and detecting a third light L3, which is diffracted by the diffraction part 20, using a detection part 40 (in S300).

The first spectroscopic process may further include rotating and/or moving the detection part 40 including the pixels Px to change a resolution in a wavelength-dependent manner (in S400) and obtaining information on wavelengths according to positions of the pixels Px (in S500).

A first thickness T1, which is defined as a total thickness of the first substrate 100, the peripheral circuit structure PS, the second substrate 200, and the first mold structure MSa, and the first particular dimension CD1 may be measured by the first spectroscopic process. As a result of the first spectroscopic process, it may be possible to check whether the first mold structure MSa and the first vertical channel holes CHa are formed to meet desired specifications therefor and thereby to improve the reliability of the semiconductor memory device.

Referring to FIG. 3, at S600, wavelength-corrected images of the device shown in FIGS. 6A-6C may be generated based on receiving and/or processing optical signals obtained from the pixels of the detection part 40 based on performing S100-S500, where such receiving and/or processing may include performing wavelength correction of pixels of the image generated from the optical signals of the pixels Px of the detection part 40 as described herein (e.g., to generate a wavelength-corrected image of the device shown in FIGS. 6A-6C). The upper diameter of each of the first vertical channel holes Cha in the generated image (e.g., wavelength-corrected image) may be measured to determine whether the first particular dimension CD1 (e.g., the upper diameter of each of the first vertical channel holes Cha) at least meets a threshold dimension value. If so, at S600, the device shown in FIGS. 6A-6C may be determined to be non-defective and selectively forwarded to one or more further manufacturing steps to manufacture a semiconductor memory device as shown in FIGS. 7A-9C. If not, at S600, the device shown in FIGS. 6A-6C may be determined to have at least one process defect and may be selectively forwarded to a refurbishment and/or repair operation to correct the upper diameter of each of the first vertical channel holes Cha. In some example embodiments, if not, at S600, the device shown in FIGS. 6A-6C may be determined to have at least one process defect and may be selectively forwarded to a discard operation to discard the device, to thereby prevent the determined process defects from being included in a manufactured semiconductor memory device which may be included in a manufactured electronic device, thereby enabling improved functionality and/or reliability of the manufactured electronic device (e.g., improved functionality and/or reliability of the manufactured semiconductor memory device). Accordingly, it will be understood that the operations represented at FIGS. 7A-9C may be selectively performed based on performing the method shown in FIG. 3 based on operation of the spectroscopic device shown in FIGS. 1-2B.

Figure 7A:
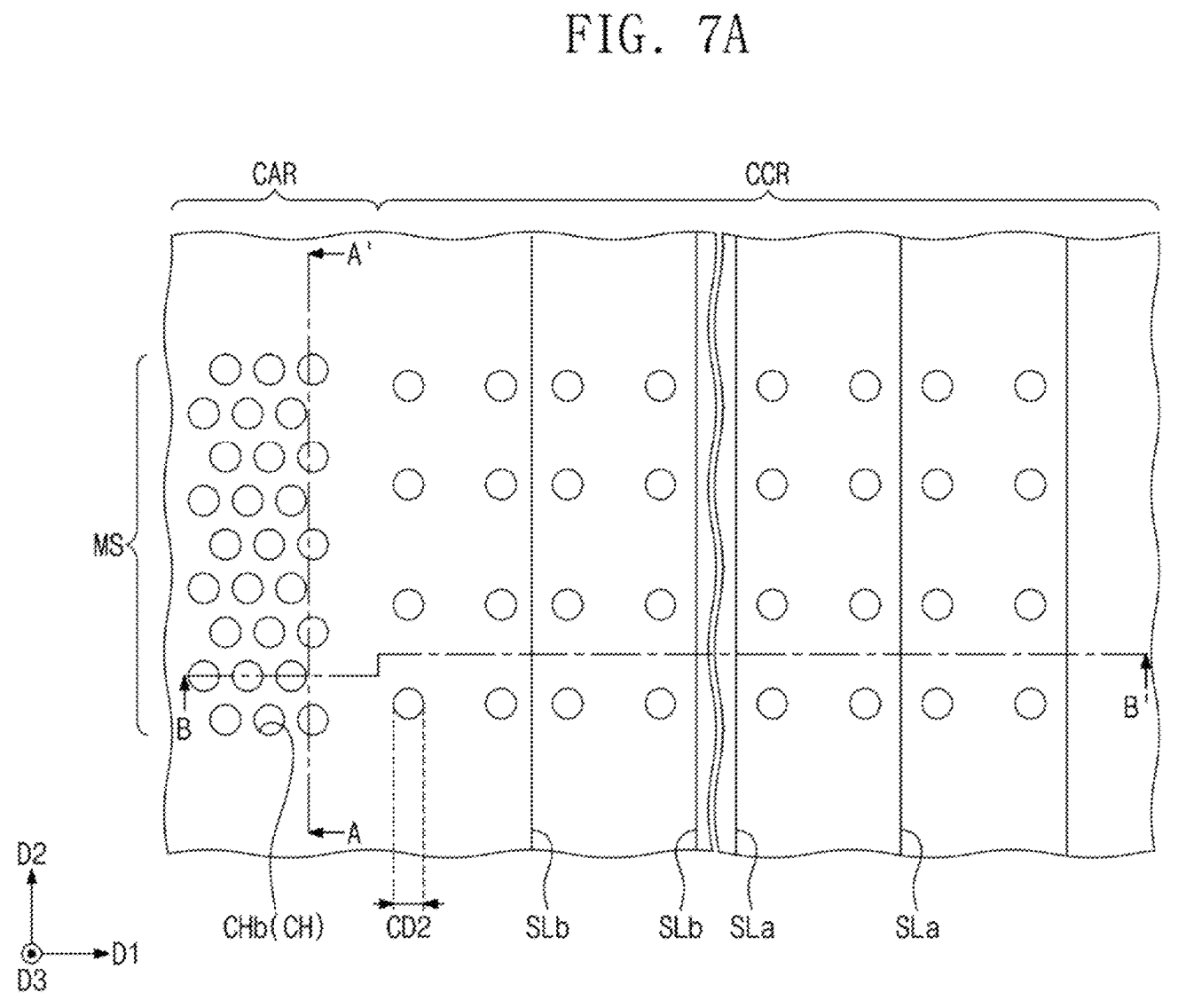
Figure 7B:
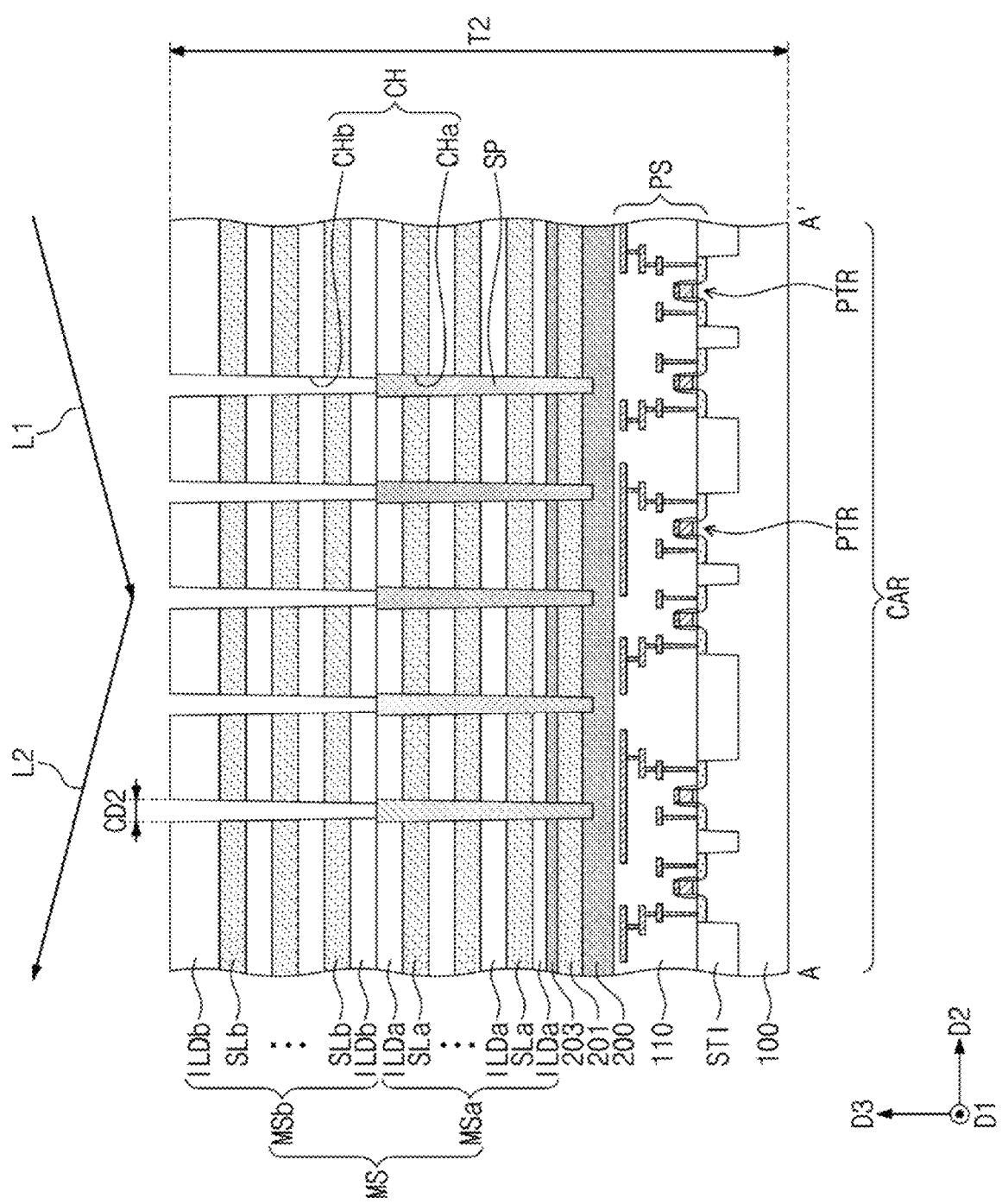
Figure 7C:
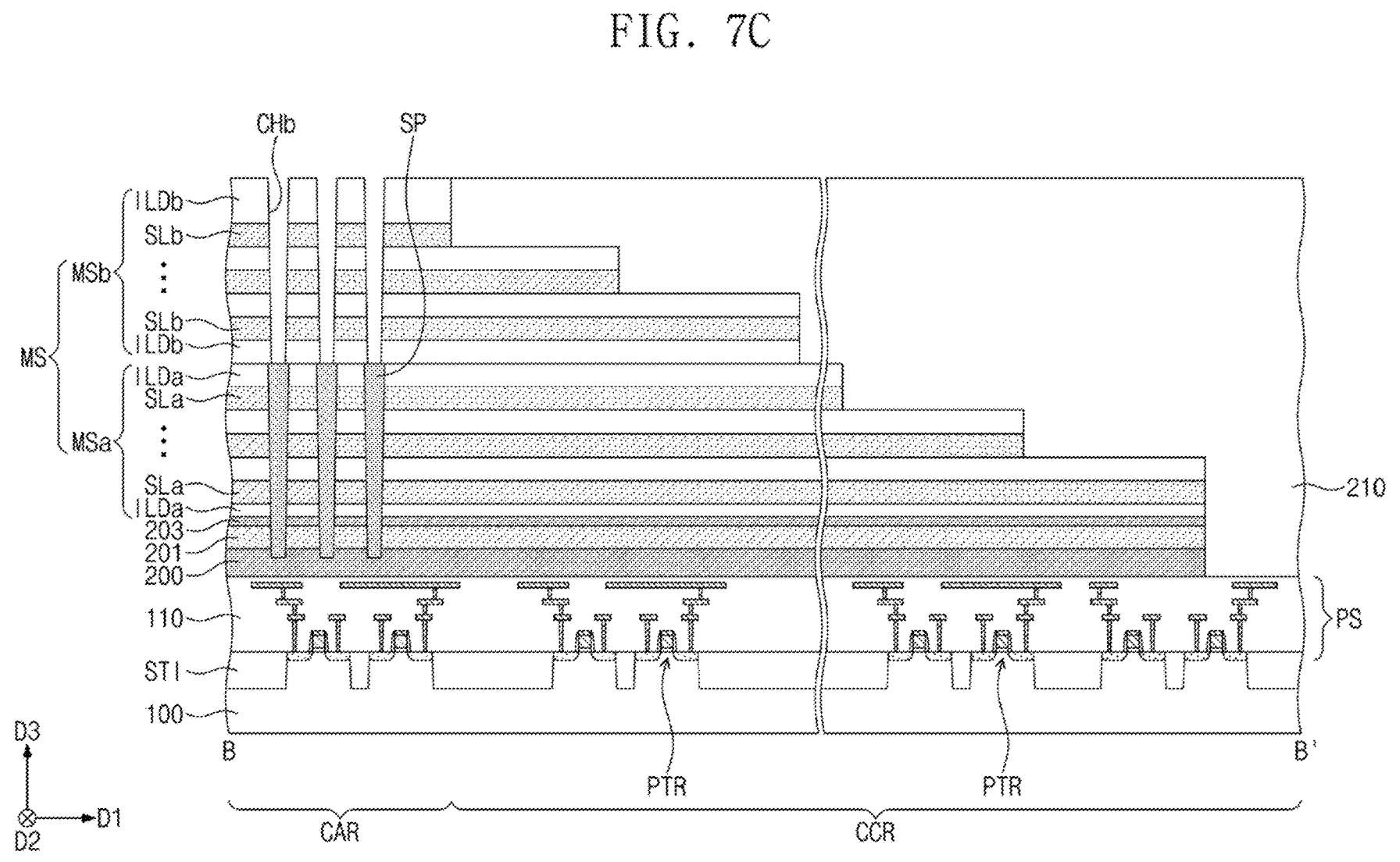

Referring to FIGS. 7A, 7B, and 7C, sacrificial patterns SP may be formed to fill the first vertical channel holes CHa. The sacrificial patterns SP may be formed of or include a material, which is chosen to have an etch selectivity with respect to not only the first interlayer dielectric layers ILDa and the first sacrificial layers SLa of the first mold structure MSa but also second interlayer dielectric layers ILDb and second sacrificial layers SLb of a second mold structure MSb to be described below. For example, the sacrificial patterns SP may be formed of or include poly silicon.

The second mold structure MSb may be formed on the first mold structure MSa. The first and second mold structures MSa and MSb may constitute a mold structure MS. The formation of the second mold structure MSb may include alternately and repeatedly stacking the second interlayer dielectric layers ILDb and the second sacrificial layers SLb on a top surface of the first mold structure MSa and performing a second trimming process on the second interlayer dielectric layers ILDb and the second sacrificial layers SLb. The second trimming process may be performed in substantially the same manner as the first trimming process. As a result of the second trimming process, the second mold structure MSb may have a staircase structure.

The second sacrificial layers SLb may be formed of or include a material having an etch selectivity with respect to the first and second interlayer dielectric layers ILDa and ILDb. The second interlayer dielectric layers ILDb may be formed of or include the same insulating material as the first interlayer dielectric layers ILDa, and the second sacrificial layers SLb may be formed of or include the same insulating material as the first sacrificial layers SLa. For example, the second interlayer dielectric layers ILDb may be formed of silicon oxide, and the second sacrificial layers SLb may be formed of silicon nitride.

A second insulating layer 210 may be formed to cover the staircase structures of the first and second mold structures MSa and MSb. More specifically, the formation of the second insulating layer 210 may include depositing an insulating material to cover the staircase structure of the first mold structure MSa, after the first trimming process, and depositing an insulating material to cover the staircase structure of the second mold structure MSb, after the second trimming process. In some example embodiments, the second insulating layer 210 may be formed of or include at least one of silicon oxide, silicon nitride, silicon oxynitride, and/or low-k dielectric materials. A top surface of the second insulating layer 210 may be substantially coplanar with a top surface of the second mold structure MSb (i.e., a top surface of the uppermost one of the second interlayer dielectric layers ILDb). In the following description, the expression of "two elements are coplanar with each other" may mean that a planarization process may be performed on the elements. The planarization process may be performed using, for example, a chemical mechanical polishing (CMP) process or an etch-back process.

Second vertical channel holes CHb may be formed to penetrate the second mold structure MSb and to be connected to the first vertical channel holes CHa. Each pair of the first and second vertical channel holes CHa and CHb, which are connected to each other, may constitute a vertical channel hole CH. When viewed in the plan view of FIG. 7A, the second vertical channel holes CHb may be formed at substantially the same positions as the first vertical channel holes CHa. A lower diameter of each of the second vertical channel holes CHb may be different from an upper diameter (i.e., the first particular dimension CD1) of each of the first vertical channel holes CHa. For example, the lower diameter of each of the second vertical channel holes CHb may be smaller than the upper diameter of each of the first vertical channel holes CHa.

As a height in the third direction D3 increases, widths of the second vertical channel holes CHb measured in the first and second directions D1 and D2 may increase. An upper diameter of each of the second vertical channel holes CHb may be defined as a second particular dimension CD2 (e.g., a second critical dimension, including a size of a second element of a semiconductor memory device where the size of the second element affects the electrical properties of the semiconductor memory device).

Referring back to FIGS. 1 and 3, after the formation of the second vertical channel holes CHb, a second spectroscopic process may be performed (e.g., performing some or all of steps S100 to S600 shown in FIG. 3 on the device shown in FIGS. 7A to 7C), and in some example embodiments, the second spectroscopic process may include sending the first light L1 from the light source part 10 toward a top surface of the second mold structure MSb (in S100), diffracting the second light L2, which is reflected from the top surface of the second mold structure MSb, using the diffraction part 20 (in S200), and detecting the third light L3, which is diffracted by the diffraction part 20, using the detection part 40 (in S300). According to some example embodiments of the inventive concepts, the spectroscopic process may be performed at least two times during the process of fabricating the semiconductor memory device.

A second thickness T2, which is defined as a total thickness of the first substrate 100, the peripheral circuit structure PS, the second substrate 200, and the first and second mold structures MSa and MSb, and the second particular dimension CD2 may be measured by the second spectroscopic process. As a result of the second spectroscopic process, it may be possible to check whether the second mold structure MSb and the second vertical channel holes CHb are formed to meet desired specifications therefor and thereby to improve the reliability of the semiconductor memory device.

For example, referring to FIG. 3, at S600, wavelength-corrected images of the device shown in FIGS. 7A-7C may be generated based on receiving and/or processing optical signals obtained from the pixels of the detection part 40 based on performing S100-S500, where such receiving and/or processing may include performing wavelength correction of pixels of the image generated from the optical signals of the pixels Px of the detection part 40 as described herein (e.g., to generate a wavelength-corrected image of the device shown in FIGS. 7A-7C). The upper diameter of each of the second vertical channel holes CHb in the generated image may be measured to determine whether the second particular dimension CD2 (e.g., the upper diameter of each of the second vertical channel holes CHb) at least meets a threshold dimension value. If so, at S600, the device shown in FIGS. 7A-7C may be determined to be non-defective and selectively forwarded to one or more further manufacturing steps to manufacture a semiconductor memory device as shown in FIGS. 8A-9C. If not, at S600, the device shown in FIGS. 7A-7C may be determined to have at least one process defect and may be selectively forwarded to a refurbishment and/or repair operation to correct the upper diameter of each of the first vertical channel holes Cha. In some example embodiments, if not, at S600, the device shown in FIGS. 7A-7C may be determined to have at least one process defect and may be selectively forwarded to a discard operation to discard the device, to thereby prevent the determined process defects from being included in a manufactured semiconductor memory device which may be included in a manufactured electronic device, thereby enabling improved functionality and/or reliability of the manufactured electronic device (e.g., improved functionality and/or reliability of the manufactured semiconductor memory device). Accordingly, it will be understood that the operations represented at FIGS. 8A-9C may be selectively performed based on performing the method shown in FIG. 3 based on operation of the spectroscopic device shown in FIGS. 1-2B.

As described above, the method of fabricating the mold structure MS may include steps of forming the first mold structure MSa on the second substrate 200, forming the first vertical channel holes CHa, performing the first spectroscopic process, forming the second mold structure MSb on the first mold structure MSa, forming the second vertical channel holes CHb, and performing the second spectroscopic process, but the inventive concepts are not limited to this example.

In some example embodiments, the formation of the mold structure MS may include alternately and repeatedly stacking interlayer dielectric layers and sacrificial layers, forming the vertical channel holes CH to penetrate the interlayer dielectric layers and the sacrificial layers and to expose portions of the second substrate 200, and performing the spectroscopic process once. Here, each vertical channel hole CH may have a side surface without a stepwise portion, and as a distance in the third direction D3 increases, widths of each vertical channel hole CH in the first and second directions D1 and D2 may increase.

Figure 8A:
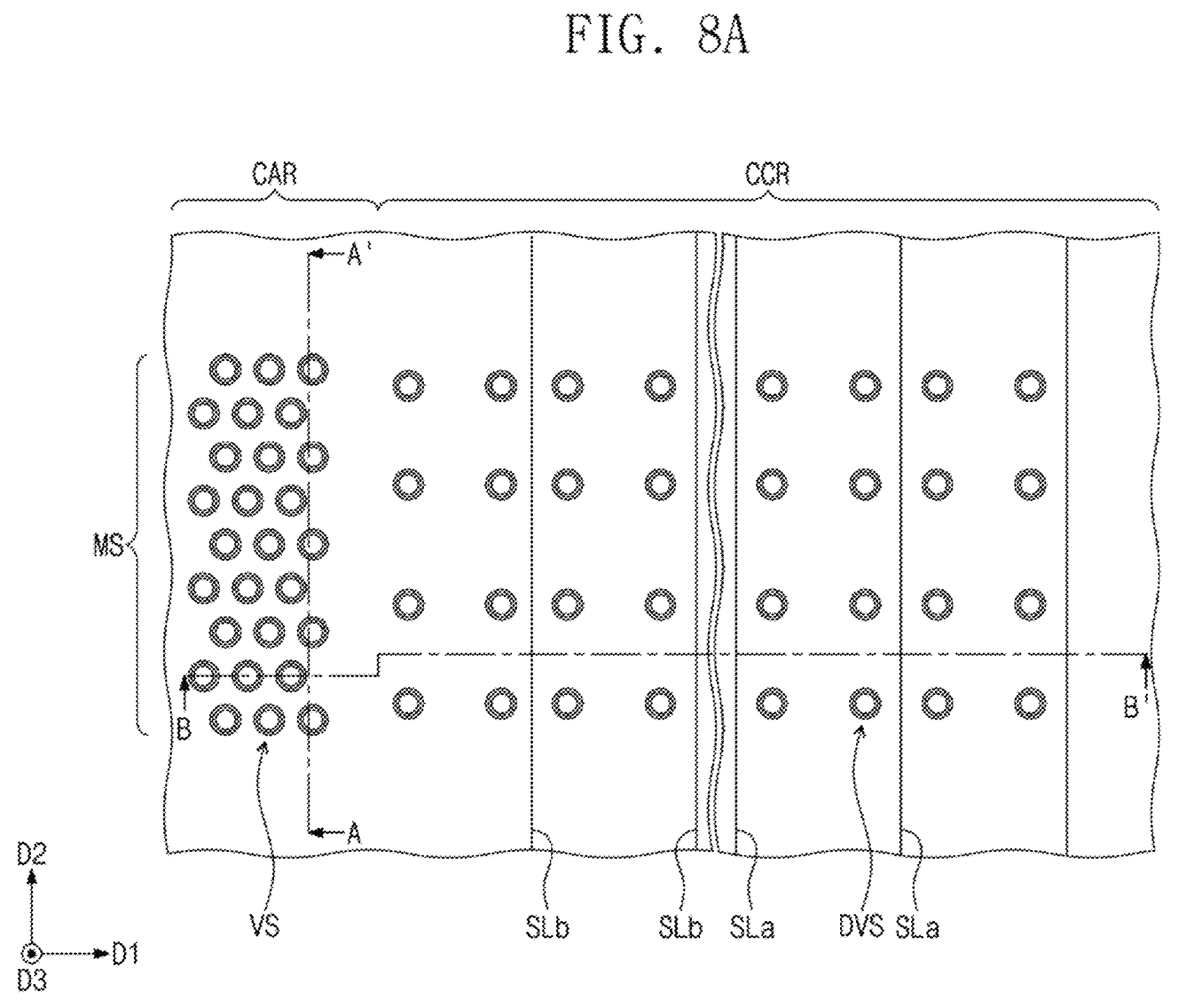
Figure 8B:
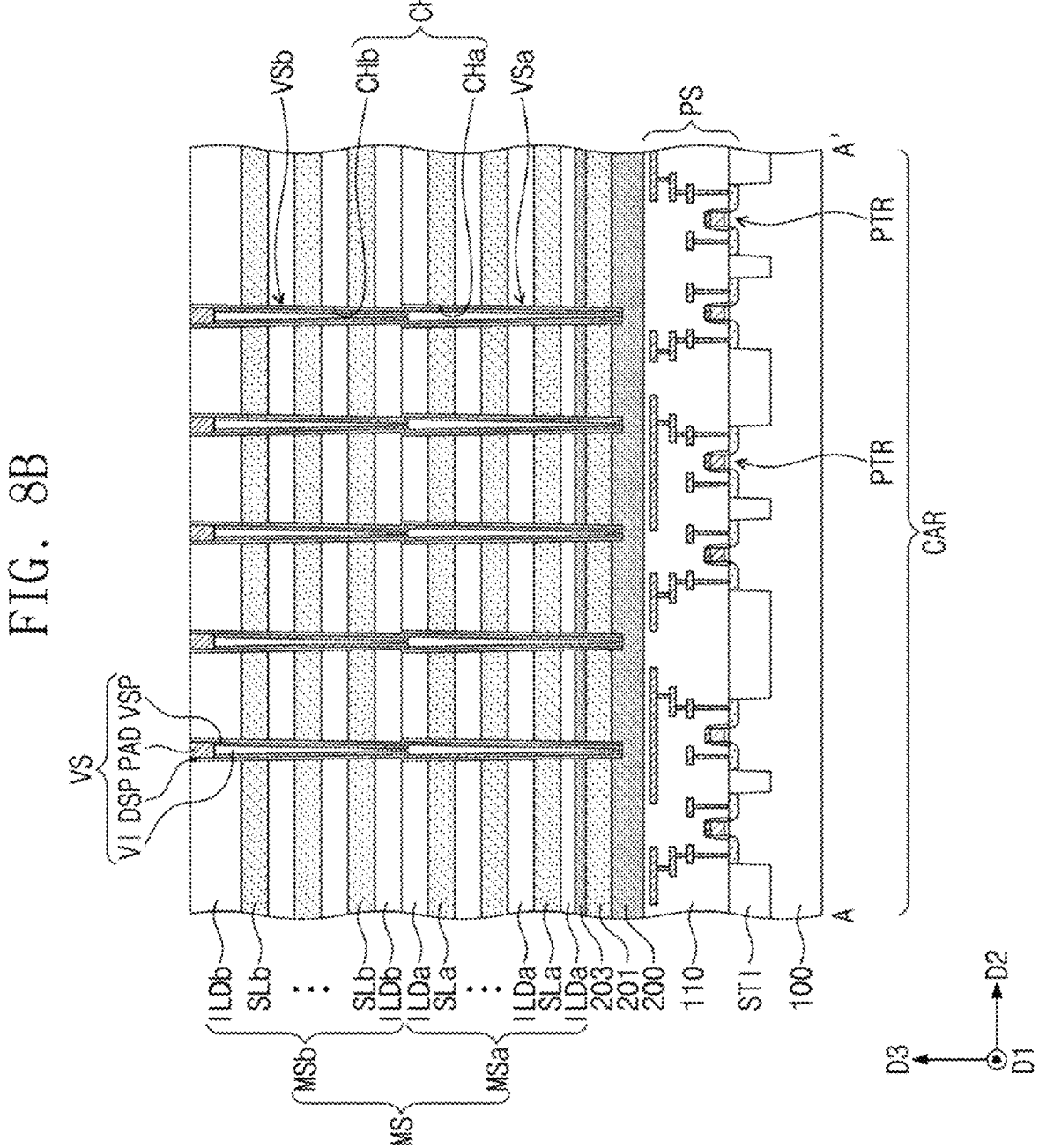
Figure 8C:
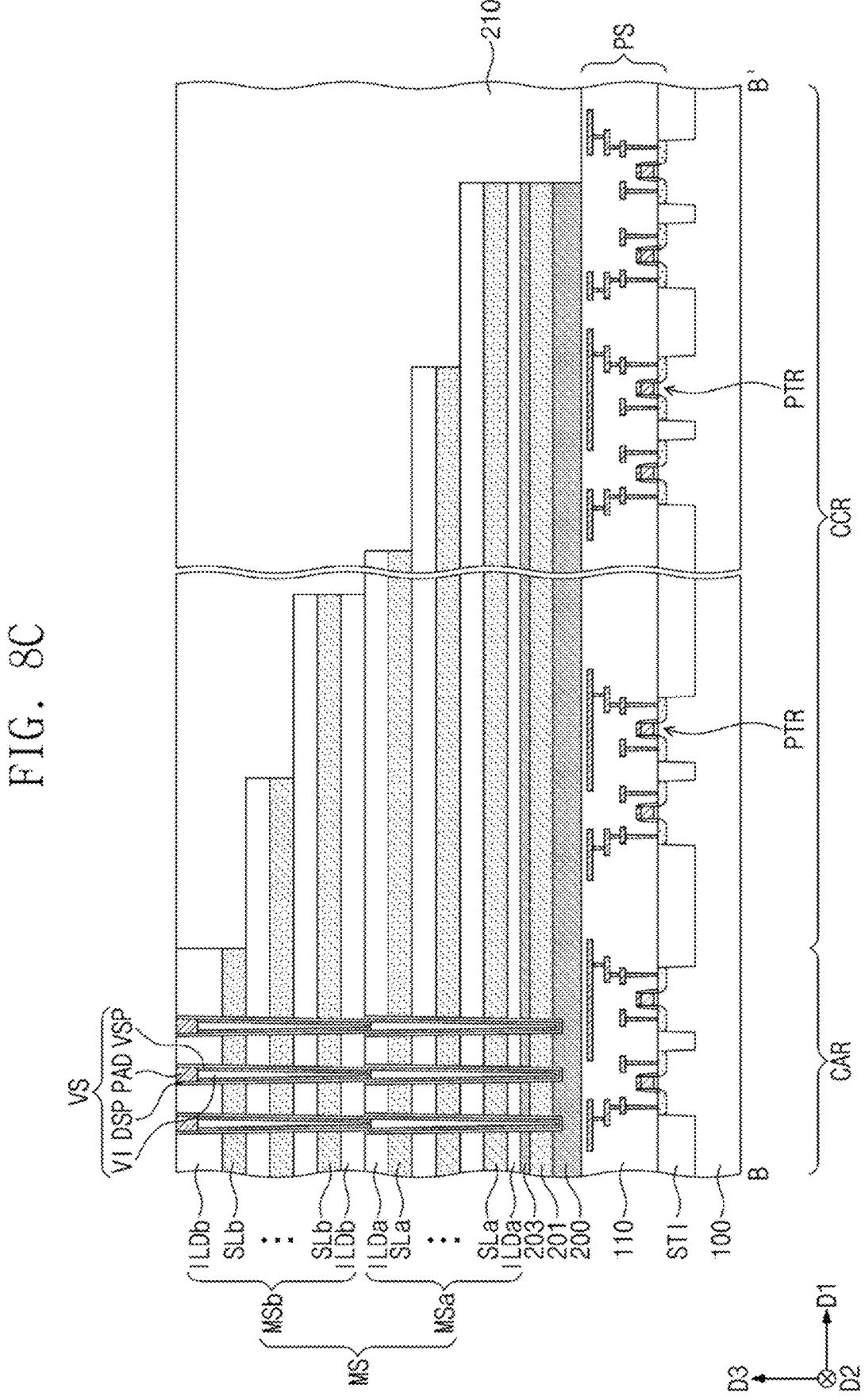

Referring to FIGS. 8A, 8B, and 8C, the sacrificial patterns SP may be removed from the first vertical channel holes CHa. After the removal of the sacrificial patterns SP, vertical channel structures VS may be formed on the cell array region CAR to fill the vertical channel holes CH. Each of the vertical channel structures VS may include a first vertical channel structure VSa, which is formed to fill each of the first vertical channel holes CHa, and a second vertical channel structure VSb, which is formed to fill each of the second vertical channel holes CHb. In addition, dummy vertical channel structures DVS may be formed on the contact region CCR to fill the vertical channel holes CH.

The formation of the vertical channel structures VS may include forming a data storage pattern DSP, a vertical semiconductor pattern VSP, a gapfill insulating pattern VI, and a conductive pad PAD, which are provided to fill each of the vertical channel holes CH.

The data storage pattern DSP may be formed to cover an inner side surface of each of the vertical channel holes CH. The formation of the data storage pattern DSP may include sequentially forming a plurality of insulating layers. For example, the data storage pattern DSP may include a blocking insulating layer, charge storing layer and tunneling insulating layer, which are sequentially stacked on the inner side surface of each of the vertical channel holes CH. The charge storing layer may be interposed between the blocking insulating layer and the tunneling insulating layer. In some example embodiments, the blocking insulating layer and the tunneling insulating layer may be formed of or include silicon oxide, and the charge storing layer may be formed of or include silicon nitride.

The vertical semiconductor pattern VSP may be formed to conformally cover a side surface of the data storage pattern DSP. In some example embodiments, the vertical semiconductor pattern VSP may be formed of or include poly silicon.

The gapfill insulating pattern VI may be formed to fill an internal space of each vertical channel hole CH covered with the vertical semiconductor pattern VSP.

The conductive pad PAD may be formed on the vertical semiconductor pattern VSP and the gapfill insulating pattern VI. The conductive pad PAD may be formed of or include at least one of, for example, doped semiconductor materials or conductive materials. The formation of the conductive pad PAD may include partially etching the vertical semiconductor pattern VSP and the gapfill insulating pattern VI, which are overlapped with the uppermost one of the second interlayer dielectric layers ILDb in a horizontal direction, and filling a space, which is defined by a side surface of the data storage pattern DSP and top surfaces of the vertical semiconductor pattern VSP and the gapfill insulating pattern VI, with a doped semiconductor material or a conductive material. A top surface of the conductive pad PAD may be substantially coplanar with the top surface of the uppermost one of the second interlayer dielectric layers ILDb.

Figure 9A:
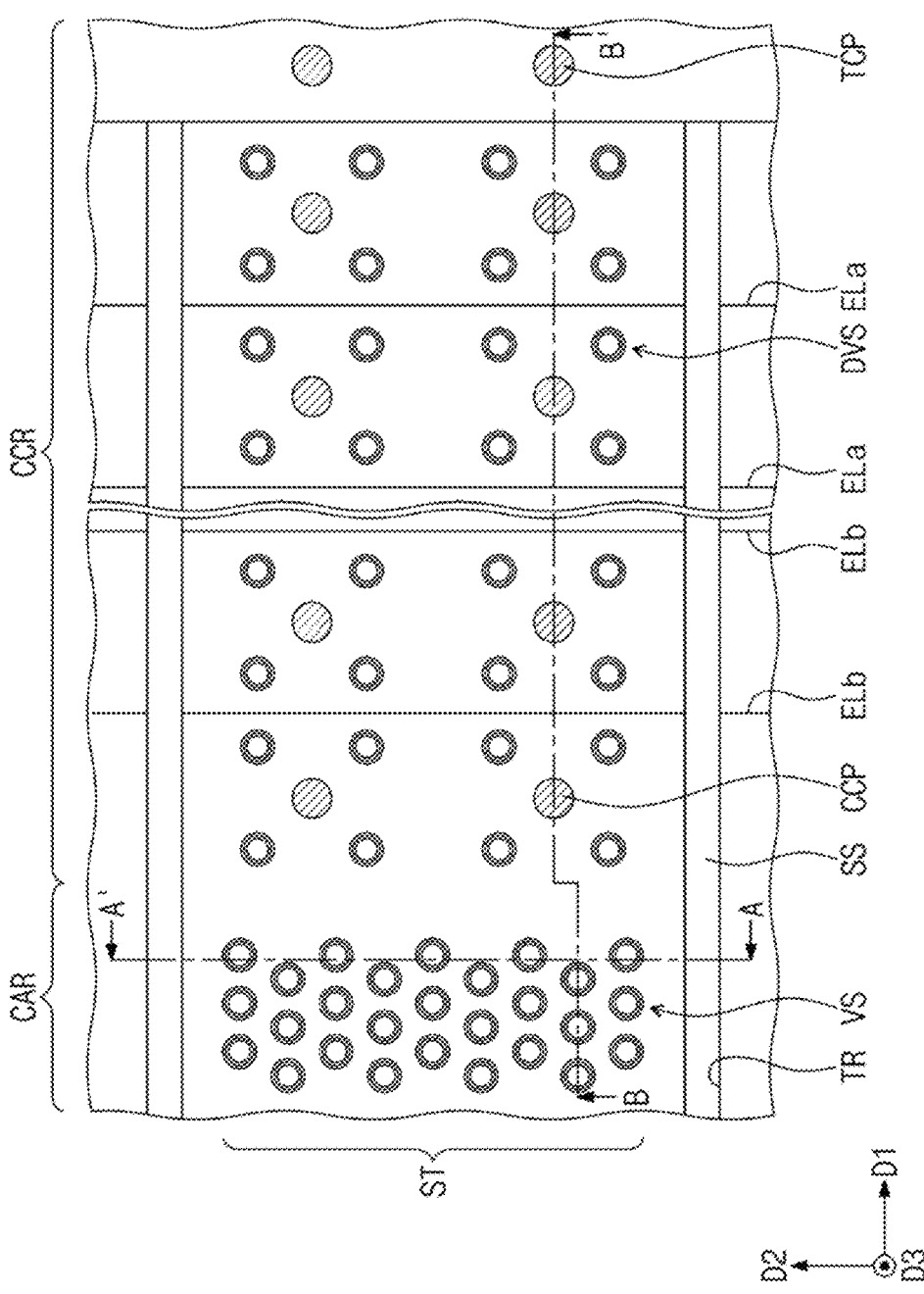
Figure 9B:
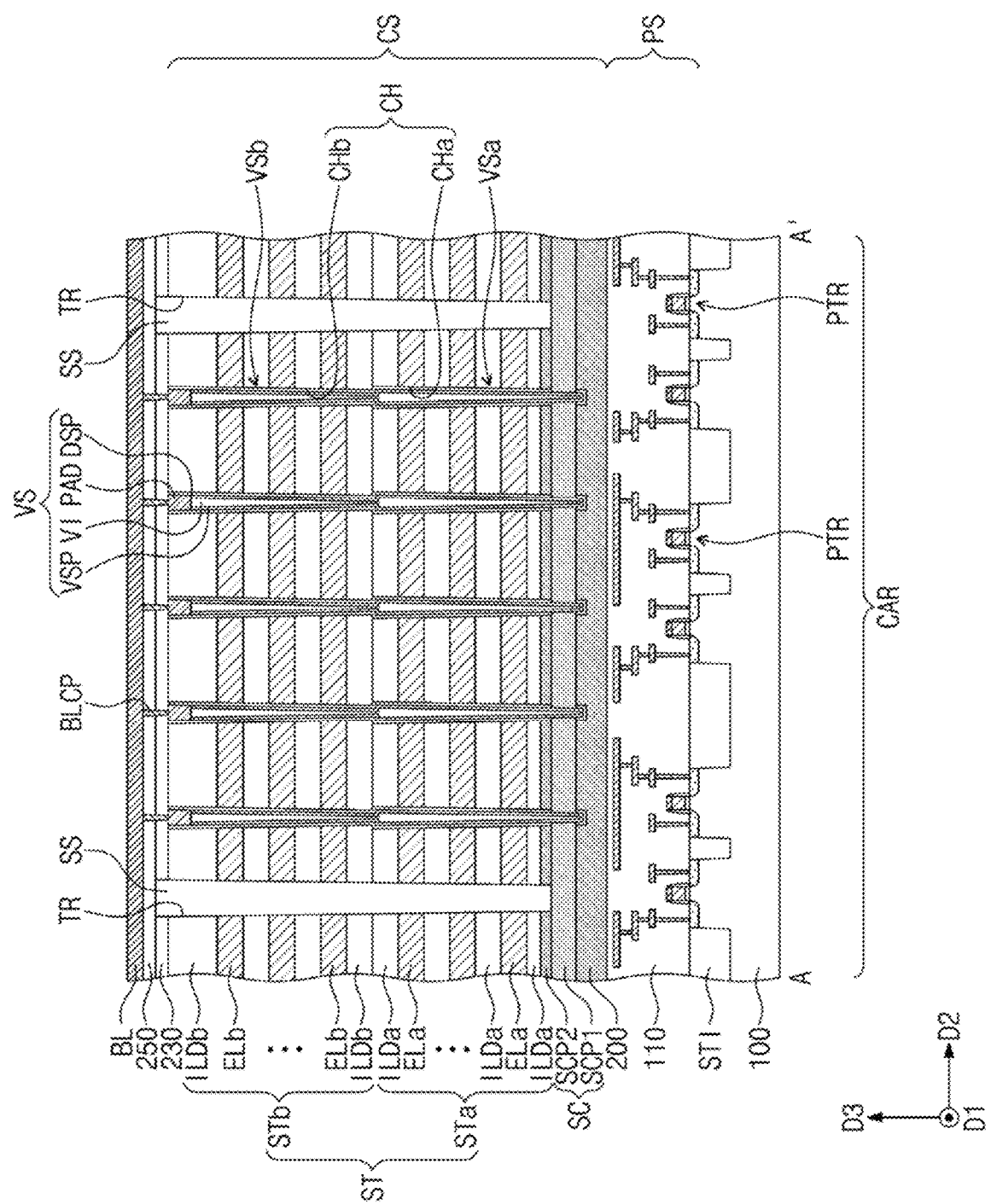
Figure 9C:
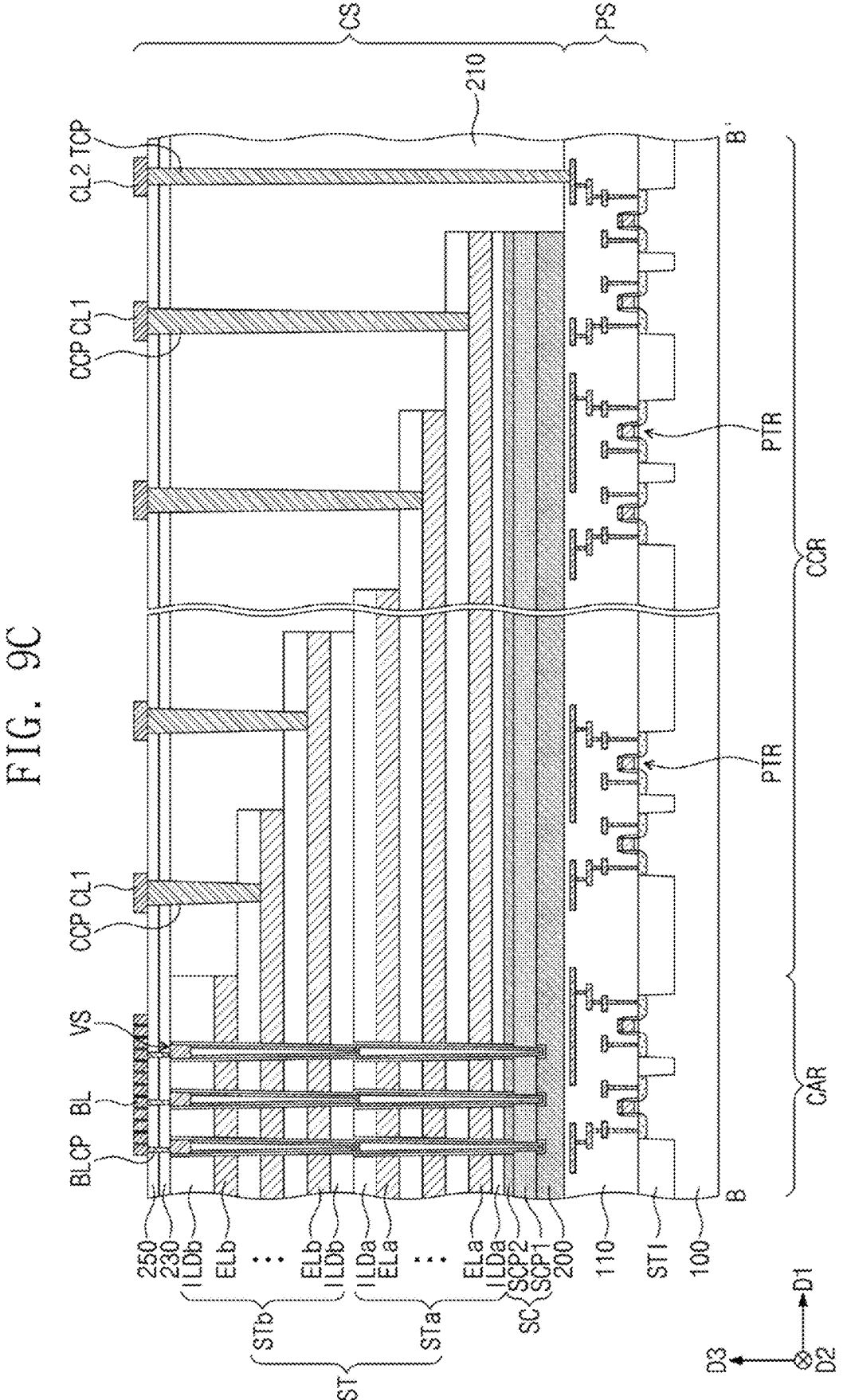

Referring to FIGS. 9A, 9B, and 9C in conjunction with FIGS. 8A, 8B, and 8C, a third insulating layer 230 may be formed to cover a top surface of the mold structure MS and top surfaces of the vertical channel structures VS.

Trenches TR may be formed to penetrate the third insulating layer 230, the mold structure MS, and the lower semiconductor layer 203 and to extend in the first direction D1. The lower sacrificial layer 201 and the first and second sacrificial layers SLa and SLb may be exposed to the outside through the trenches TR. Thereafter, the lower sacrificial layer 201 and the first and second sacrificial layers SLa and SLb, which are exposed through the trenches TR, may be selectively removed. The selective removal of the sacrificial layers 201, SLa, and SLb may be performed using, for example, a wet etching process using an etching solution. The first and second interlayer dielectric layers ILDa and ILDb may not be removed during the selective removal of the sacrificial layers 201, SLa, and SLb. At least a portion of the data storage pattern DSP may be removed during the removal of the lower sacrificial layer 201, and in some example embodiments, a portion of a side surface of the vertical semiconductor pattern VSP may be exposed.

A first source conductive pattern SCP1 may be formed to fill a space, which is formed by removing the lower sacrificial layer 201. The lower semiconductor layer 203 on the first source conductive pattern SCP1 may be referred to as a second source conductive pattern SCP2. In some example embodiments, the first and second source conductive patterns SCP1 and SCP2 may constitute a source structure SC. Each of the first and second source conductive patterns SCP1 and SCP2 may be formed of or include a doped semiconductor material. In some example embodiments, an impurity concentration of the first source conductive pattern SCP1 may be higher than an impurity concentration of the second source conductive pattern SCP2.

First and second gate electrodes ELa and ELb may be formed to fill spaces, which are formed by removing the first and second sacrificial layers SLa and SLb, and as a result, a stack structure ST including a first stack structure STa and a second stack structure STb may be formed. Here, the first stack structure STa may include the first gate electrodes ELa and the first interlayer dielectric layers ILDa, and the second stack structure STb may include the second gate electrodes ELb and the second interlayer dielectric layers ILDb. In addition, the second substrate 200, the stack ST, and the vertical channel structures VS may constitute a cell array structure CS. That is, the semiconductor memory device may include the first substrate 100, the peripheral circuit structure PS on the first substrate 100, and the cell array structure CS on the peripheral circuit structure PS.

Here, as a distance from the second substrate 200 (i.e., in the third direction D3) increases, lengths of the first and second gate electrodes ELa and ELb in the first direction D1 may decrease. That is, the length of each of the first and second gate electrodes ELa and ELb in the first direction D1 may be larger than a length, in the first direction D1, of another electrode thereon. The lowermost one of the first gate electrodes ELa of the first stack structure STa may have the largest length in the first direction D1, and the uppermost one of the second gate electrodes ELb of the second stack structure STb may have the smallest length in the first direction D1. As a distance from the vertical channel structure VS increases, a thickness of each of the first and second stack structures STa and STb may decrease, and the side surfaces of the first and second gate electrodes ELa and ELb may be spaced apart from each other by a substantially constant distance in the first direction D1, when viewed in the plan view of FIG. 9A.

Thereafter, separation structures SS may be formed to fill the trenches TR. The separation structures SS may be extended in the first direction D1 to cross the stack ST, when viewed in the plan view of FIG. 9A. A top surface of each of the separation structures SS may be substantially coplanar with a top surface of the third insulating layer 230. In some example embodiments, the separation structures SS may be formed of or include silicon oxide.

A fourth insulating layer 250 may be formed to cover the top surface of the third insulating layer 230 and the top surfaces of the separation structures SS. In some example embodiments, each of the third and fourth insulating layers 230 and 250 may be formed of or include at least one of silicon oxide, silicon nitride, silicon oxynitride, and/or low-k dielectric materials.

Bit line contact plugs BLCP may be formed on the cell array region CAR to penetrate the third and fourth insulating layers 230 and 250 and may be connected to the vertical channel structures VS. Each of the bit line contact plugs BLCP may be electrically connected to the conductive pad PAD of each of the vertical channel structures VS.

Cell contact plugs CCP may be formed on the contact region CCR to penetrate the second to fourth insulating layers 210, 230, and 250. Each of the cell contact plugs CCP may be provided to further penetrate one of the first and second interlayer dielectric layers ILDa and ILDb and may be electrically connected to one of the first and second gate electrodes ELa and ELb. The cell contact plugs CCP may be adjacent to the dummy vertical channel structures DVS and may be spaced apart from each other.

At least one penetration contact plug TCP may be formed on the contact region CCR to penetrate the second to fourth insulating layers 210, 230, and 250 and to be electrically connected to one of the peripheral circuit transistors PTR of the peripheral circuit structure PS. The penetration contact plug TCP may be provided to penetrate at least a portion of the first insulating layer 110 and may be electrically connected to one of the peripheral circuit interconnection lines of the peripheral circuit structure PS.

Bit lines BL may be formed on the cell array region CAR to extend in the second direction D2 and may be electrically connected to the vertical channel structures VS through the bit line contact plugs BLCP. Each of the vertical channel structures VS may be overlapped with a pair of the bit lines BL in the third direction D3 and may be electrically connected to one of them.

First conductive lines CL1 and at least one second conductive line CL2 may be formed on the contact region CCR. Here, the first conductive lines CL1 may be electrically connected to the first and second gate electrodes ELa and ELb through the cell contact plugs CCP, and the second conductive line CL2 may be electrically connected to one of the peripheral circuit transistors PTR through the penetration contact plug TCP.

Each of the bit line contact plugs BLCP, the cell contact plugs CCP, the penetration contact plug TCP, the bit lines BL, and the first and second conductive lines CL1 and CL2 may be formed of or include at least one of conductive materials (e.g., metallic materials).

In some example embodiments, an additional insulating layer may be further formed on the fourth insulating layer 250 to cover the bit lines BL and the first and second conductive lines CL1 and CL2, and additional interconnection lines may be further formed in the additional insulating layer.

In some example embodiments, a semiconductor memory device, which is fabricated by the afore-described method, may be a nonvolatile three-dimensional NAND FLASH memory device including the vertical channel structures VS. In some example embodiments, the semiconductor memory device may be configured to write and/or change data in the data storage pattern DSP using the Fowler-Nordheim tunneling phenomenon induced by a voltage difference between the vertical semiconductor pattern VSP and the first and second gate electrodes ELa and ELb. However, the inventive concepts are not limited to this example.

In a spectroscopic device according to some example embodiments of the inventive concepts and in a spectroscopic method using the same, a light source part including a plurality of auxiliary light sources may be used to correct a wavelength for each pixel of an image of a target object that is imaged by the spectroscopic device, and a rotatable and movable detection part may be used to control resolution (e.g., resolution per pixel, and/or resolution of the generated image) in a wavelength-dependent manner.

In a method of fabricating a semiconductor memory device using the spectroscopic method, the spectroscopic method may make it possible to check whether a mold structure and vertical channel holes meet desired specifications and a device having such mold structure and vertical channel holes may be selectively forwarded to further manufacturing of the semiconductor memory device or forwarded to refurbishment, repair, or discard operations based on processing images of a device generated to determine whether process defects are present in the device according to performing the spectroscopic method, and as a result, the semiconductor memory device may be fabricated to have high reliability based on having a reduced likelihood of incorporating process defects.

While example embodiments of the inventive concepts have been particularly shown and described, it will be understood by one of ordinary skill in the art that variations in form and detail may be made therein without departing from the spirit and scope of the attached claims.

What is claimed is:

1. A spectroscopic device, comprising:
   a light source part configured to emit a first light toward a target object, the light source part including a main light source and a plurality of auxiliary light sources, the plurality of auxiliary light sources configured to emit light rays of different wavelengths such that the first light includes first light rays of the different wavelengths;
   a diffraction part including a diffraction grating configured to diffract a second light to produce a third light, the second light produced based on the first light being reflected from the target object;
   a detection part configured to detect the third light, the detection part including a plurality of pixels and an actuator; and
   an analyzing part connected to the detection part,
   wherein the actuator is configured to rotate and move the detection part, wherein the analyzing part is configured to determine wavelength information corresponding to a first pixel of the plurality of pixels based on a second pixel of the plurality of pixels detecting the third light.

2. The spectroscopic device of claim 1, further comprising:

a slit part between the diffraction part and the detection part, the slit part configured to enable transmission of the third light through the slit part.

3. The spectroscopic device of claim 1, wherein the actuator is configured to move the detection part in a horizontal direction and a vertical direction.

4. The spectroscopic device of claim 3, wherein the second light includes second light rays and the third light includes third light rays, the diffraction grating of the diffraction part is configured to cause the second light rays of the second light to be diffracted into the third light rays of the third light such that each respective second light ray of the second light is diffracted at a separate, respective angle of diffraction that is proportional to a respective wavelength of the respective second light ray to produce a separate third light ray of the third light, the diffraction grating of the diffraction part is configured to cause the third light rays of the third light to be emitted at different angles from the diffraction grating, and the actuator is configured to move the detection part in the horizontal direction such that the third light is incident on a center of a top surface of the detection part.

5. The spectroscopic device of claim 3, wherein the actuator is configured to rotate the detection part in a direction inclined to the vertical direction such that the plurality of pixels of the detection part have position-dependent resolutions per pixel.

6. The spectroscopic device of claim 1, wherein a wavelength spectrum of the first light ranges from 100 nm to 1000 nm.

7. The spectroscopic device of claim 1, wherein a top surface of the detection part has a flat shape or a curved shape.

8. A spectroscopic method using a spectroscopic device, wherein the spectroscopic device includes a light source part including a main light source and a plurality of auxiliary light sources, a diffraction part including a diffraction grating, a detection part including a plurality of pixels and an actuator, and an analyzing part connected to the detection part, wherein the spectroscopic method comprises:

directing a first light, which is emitted from the light source part, to be incident on a target object such that a second light is reflected from the target object based on the first light being incident on the target object;

diffracting the second light reflected from the target object to produce a third light;

detecting the third light;

rotating and moving the detection part using the actuator to change a resolution per pixel of at least some pixels of the plurality of pixels in a wavelength-dependent manner;

obtaining information on wavelengths according to positions of the plurality of pixels of the detection part; and determining wavelength information corresponding to a first pixel of the plurality of pixels based on obtaining information on wavelengths corresponding to a second pixel of the plurality of pixels by detecting the third light with the second pixel, wherein the plurality of auxiliary light sources are configured to emit light rays of different wavelengths.

9. The spectroscopic method of claim 8, wherein the actuator is configured to move the detection part in a horizontal direction and a vertical direction.

10. The spectroscopic method of claim 9, wherein the actuator is configured to move the detection part in the horizontal direction such that the third light is incident on a center of a top surface of the detection part.

11. The spectroscopic method of claim 9, wherein the actuator is configured to rotate the detection part in a direction inclined to the vertical direction such that the plurality of pixels of the detection part have position-dependent resolutions per pixel.

12. The spectroscopic method of claim 8, wherein the target object is a semiconductor substrate, and a single thin film or a stack including a plurality of thin films is on the semiconductor substrate, and the spectroscopic method further includes determining a thickness of the single thin film or the stack on the semiconductor substrate based on processing the information on the wavelengths according to the positions of the plurality of pixels of the detection part.

13. The spectroscopic method of claim 8, wherein the obtaining of the information on the wavelengths according to the positions of the plurality of pixels comprises calculating a wavelength of a signal measured from an arbitrary pixel, and the calculating of the wavelength of the signal measured from the arbitrary pixel includes representing respective wavelengths of respective signals obtained from respective pixels of the plurality of pixels as a function equation of respective pixel numbers of the plurality of pixels, calculating coefficients of the function equation through auxiliary signals of the plurality of auxiliary light sources, and substituting a pixel number of the arbitrary pixel into the function equation.

14. The spectroscopic method of claim 13, wherein the function equation is an m-th order function equation, where m is a natural number, and a quantity of the plurality of auxiliary light sources is (m+1).

15. A method of fabricating a semiconductor memory device, the method comprising:

forming a mold structure including interlayer dielectric layers and sacrificial layers, which are alternately and repeatedly stacked on a substrate;

forming vertical channel holes to penetrate the mold structure;

performing a spectroscopic process on the mold structure and the vertical channel holes;

forming vertical channel structures in the vertical channel holes; and forming gate electrodes to fill empty spaces, the empty spaces are formed based on selectively removing the sacrificial layers of the mold structure, wherein the spectroscopic process includes directing a first light, which is emitted from a light source part including a main light source and a plurality of auxiliary light sources, to be incident on the mold structure such that a second light is reflected from the mold structure based on the first light being incident on the mold structure;

diffracting the second light reflected from the mold structure to produce a third light;

detecting the third light;

rotating and moving a detection part including an actuator and a plurality of pixels to change a resolution per pixel of at least some pixels of the plurality of pixels in a wavelength-dependent manner;

obtaining information on wavelengths according to positions of the plurality of pixels of the detection part based on the rotating and moving of the detection part using the actuator; and determining wavelength information corresponding to a first pixel of the plurality of pixels based on obtaining information on wavelengths corresponding to a second pixel of the plurality of pixels by detecting the third light with the second pixel, wherein the plurality of auxiliary light sources are configured to emit light rays of different wavelengths, and wherein the actuator is used to rotate and move the detection part.

16. The method of claim 15, wherein the spectroscopic process is performed to measure a thickness of the mold structure, and a particular dimension (CD) which is an upper diameter of each of the vertical channel holes.

17. The method of claim 15, wherein the sacrificial layers comprise a material having an etch selectivity with respect to the interlayer dielectric layers.

18. The method of claim 15, wherein the forming of the vertical channel structures comprises:

forming a data storage pattern to cover an inner side surface of each of the vertical channel holes;

forming a vertical semiconductor pattern to conformally cover a side surface of the data storage pattern; and forming a conductive pad on the vertical semiconductor pattern, wherein the forming of the data storage pattern comprises sequentially stacking a plurality of insulating layers.

19. The method of claim 15, wherein the actuator is configured to move the detection part in a horizontal direction and a vertical direction.

20. The method of claim 19, wherein the actuator is configured to rotate the detection part in a direction inclined to the vertical direction such that the plurality of pixels of the detection part have position-dependent resolutions.

* * * * *